United States Patent
Saitoh et al.

(10) Patent No.: US 9,366,793 B2
(45) Date of Patent: Jun. 14, 2016

(54) CIRCULARLY POLARIZING PLATE, RETARDATION PLATE FOR CIRCULARLY POLARIZING PLATE, AND ORGANIC ELECTROLUMINESCENCE DISPLAY APPARATUS

(71) Applicant: FUJIFILM Corporation, Tokyo (JP)

(72) Inventors: Yukito Saitoh, Kanagawa (JP); Hiroshi Sato, Kanagawa (JP); Mitsuyoshi Ichihashi, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 14/861,309

(22) Filed: Sep. 22, 2015

(65) Prior Publication Data

US 2016/0011352 A1   Jan. 14, 2016

Related U.S. Application Data

(63) Continuation of application No. PCT/JP2014/058072, filed on Mar. 24, 2014.

(30) Foreign Application Priority Data

Mar. 25, 2013   (JP) .................................. 2013-062443

(51) Int. Cl.
*H01L 33/00* (2010.01)
*G02B 5/30* (2006.01)
(Continued)

(52) U.S. Cl.
CPC ............ *G02B 5/3083* (2013.01); *G02B 5/3016* (2013.01); *G02B 5/3025* (2013.01); *G02B 5/3033* (2013.01); *H01L 27/3232* (2013.01); *H01L 51/5281* (2013.01)

(58) Field of Classification Search
CPC .. G02B 5/3083; G02B 5/3016; G02B 5/3025; G02B 5/3033; H01L 27/3232; H01L 51/5281

USPC .......... 257/98; 349/74, 115, 96–98, 117–119; 359/489.06

See application file for complete search history.

(56) References Cited

U.S. PATENT DOCUMENTS 7,006,184 B2 *   2/2006   Mi ........................ G02F 1/1395
                                                          349/117
7,473,446 B2 *   1/2009   Ito ....................... C09K 19/2007
                                                          252/299.1

(Continued)

FOREIGN PATENT DOCUMENTS

JP          3174367 B2   6/2001

OTHER PUBLICATIONS

International Search Report issued in PCT/JP2014/058072 on Jun. 24, 2014.

(Continued)

*Primary Examiner* — Jessica Stultz
*Assistant Examiner* — Vu A Vu
(74) *Attorney, Agent, or Firm* — Jean C. Edwards, Esq.; Edwards Neils LLC

(57) ABSTRACT

A circularly polarizing plate includes a polarizing film, a first optically anisotropic layer, and a second optically anisotropic layer in this order, in which the first optically anisotropic layer contains a twisted aligned liquid crystal compound of which a helical axis is a thickness direction thereof, a helix angle of the liquid crystal compound is 28.6±10°, an absorption axis of the polarizing film and an in-plane slow axis of the second optically anisotropic layer are parallel or orthogonal to each other, $\Delta nd$ and $ReB(550)$ respectively fall in predetermined value ranges. The circularly polarizing plate can sufficiently suppress the mixing of black with other colors in a front direction when being stuck on a display apparatus. A retardation plate used for the circularly polarizing plate and an organic EL display apparatus that have the circularly polarizing plate are also provided.

16 Claims, 4 Drawing Sheets

(51) Int. Cl.
*H01L 27/32* (2006.01)
*H01L 51/52* (2006.01)

(56) References Cited

U.S. PATENT DOCUMENTS

| | | | | |
|---|---|---|---|---|
| 7,701,537 | B2 * | 4/2010 | Takezoe | G02F 1/1334 349/115 |
| 7,755,728 | B2 * | 7/2010 | Ichihashi | G02B 5/3083 349/117 |
| 7,911,570 | B2 * | 3/2011 | Uesaka | G02F 1/133528 349/117 |
| 8,369,014 | B2 * | 2/2013 | Abdulhalim | B82Y 20/00 359/489.06 |
| 8,599,339 | B2 * | 12/2013 | Lee | G02F 1/133632 349/117 |
| 2011/0025952 | A1 * | 2/2011 | Akao | G02B 5/3083 349/74 |

OTHER PUBLICATIONS

International Preliminary Report on Patentability issued by WIPO on Oct. 6, 2015 in connection with Intl. Patent Application No. PCT/JP2014/058072.

\* cited by examiner

CIRCULARLY POLARIZING PLATE, RETARDATION PLATE FOR CIRCULARLY POLARIZING PLATE, AND ORGANIC ELECTROLUMINESCENCE DISPLAY APPARATUS

CROSS-REFERENCE TO RELATED APPLICATIONS

This application is a Continuation of PCT International Application No. PCT/JP2014/058072 filed on Mar. 24, 2014, which was published under PCT Article 21(2) in Japanese, which claims priority under 35 U.S.C. §119(a) to Japanese Patent Application No. 2013-062443 filed on Mar. 25, 2013. The above applications are hereby expressly incorporated by reference, in their entirety, into the present application.

BACKGROUND OF THE INVENTION

The present invention relates to a circularly polarizing plate, particularly, to a circularly polarizing plate having an optically anisotropic layer containing a twisted aligned liquid crystal compound.

The present invention also relates to a retardation plate for a circularly polarizing plate used for the aforementioned circularly polarizing plate and relates to an organic electroluminescence (EL) display apparatus.

Retardation plates are extremely versatile and are used for reflective LCDs, transflective LCDs, brightness enhancement films, organic EL display apparatuses, touch panels, and the like. For example, since organic EL devices have a structure in which layers having different refractive indices are laminated on each other or a structure which uses metallic electrodes, external light is reflected from the interfaces between the respective layers, and this leads to problems such as a decrease in contrast or reflection in some cases. Therefore, conventionally, in order to suppress negative effects caused by the reflection of external light, a circularly polarizing plate constituted with a retardation plate and a polarizing film is used for organic EL display apparatuses, LCD display apparatuses, and the like.

Regarding a retardation plate used for a circularly polarizing plate, for example, as described in JP 3174367 B, the use of a retardation plate constituted with a λ/2 plate and a λ/4 plate is known.

SUMMARY OF THE INVENTION

Meanwhile, in recent years, display apparatuses represented by organic EL display apparatuses have been required to further suppress mixing of black with another color observed in the front direction so as to further improve the image quality. More specifically, currently, organic EL display apparatuses using a circularly polarizing plate have a problem that a coloring which is seemingly a mixture of black and other colors (mixing of black with other colors) is easily noticed when the apparatuses are viewed from the front direction.

The inventors of the present invention prepared a circularly polarizing plate by using the retardation plate disclosed in JP 3174367 B, stuck the circularly polarizing plate on a display apparatus, and evaluated the performance thereof. As a result, they found that the mixing of black with other colors observed in the front direction was not sufficiently suppressed.

The present invention has been made in consideration of the above problem, and an object thereof is to provide a circularly polarizing plate which sufficiently suppresses the mixing of black with other colors in a front direction when being stuck on a display apparatus.

Another object of the present invention is to provide a retardation plate used for the circularly polarizing plate and an organic EL display apparatus that have the circularly polarizing plate.

As a result of conducting thorough examination regarding the conventional technical problem, the inventors found that the use of an optically anisotropic layer containing a twisted aligned liquid crystal compound can solve the above problem.

That is, they found that the above objects can be achieved by the following constitution.

(1) A circularly polarizing plate comprising a polarizing film, a first optically anisotropic layer, and a second optically anisotropic layer in this order, and satisfying a following requirement (A) or (B), wherein the first optically anisotropic layer contains a twisted aligned liquid crystal compound of which a helical axis is a thickness direction of the first optically anisotropic layer, a helix angle of the liquid crystal compound in the first optically anisotropic layer is 28.6±10°, an absorption axis of the polarizing film and an in-plane slow axis of the second optically anisotropic layer are parallel or orthogonal to each other, a value of $\Delta nd$, which is a product of a refractive index anisotropy $\Delta n$ of the first optically anisotropic layer measured at a wavelength of 550 nm and a thickness d of the first optically anisotropic layer, satisfies a following Expression (1), and ReB(550), which is a value of retardation of the second optically anisotropic layer measured at a wavelength of 550 nm, satisfies a following Expression (2):

$$256 \text{ nm} \leq \Delta nd \leq 316 \text{ nm}; \quad \text{Expression (1)}$$

$$67.5 \text{ nm} \leq ReB(550) \leq 127.5 \text{ nm}; \quad \text{Expression (2)}$$

Requirement (A): Under assumption that when the circularly polarizing plate is observed from a side of the polarizing film, counter-clockwise rotation is indicated by a positive angular value, based on an in-plane slow axis (0°) of the second optically anisotropic layer, the in-plane slow axis in a surface, which is on a side of the second optically anisotropic layer, of the first optically anisotropic layer is within a range of 33.6±10°, and the liquid crystal compound in the first optically anisotropic layer forms a counter-clockwise helix; and Requirement (B): Under assumption that when the circularly polarizing plate is observed from the side of the polarizing film, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of −33.6±10°, and the liquid crystal compound in the first optically anisotropic layer forms a clockwise helix.

(2) A circularly polarizing plate comprising a polarizing film, a first optically anisotropic layer, and a second optically anisotropic layer in this order, and satisfying a following requirement (C) or (D), wherein the first optically anisotropic layer contains a twisted aligned liquid crystal compound of which a helical axis is a thickness direction of the first optically anisotropic layer, a helix angle of the liquid crystal compound in the first optically anisotropic layer is 23.9±10°, an absorption axis of the polarizing film and an in-plane slow axis of the second optically anisotropic layer are parallel or orthogonal to each other, a value of Δnd, which is a product of a refractive index anisotropy Δn of the first optically anisotropic layer measured at a wavelength of 550 nm and a thickness d of the first optically anisotropic layer, satisfies a following Expression (3), and ReB(550), which is a value of retardation of the second optically anisotropic layer measured at a wavelength of 550 nm, satisfies a following Expression (4):

$$241 \text{ nm} \leq \Delta nd \leq 301 \text{ nm}; \quad \text{Expression (3)}$$

$$69.5 \text{ nm} \leq ReB(550) \leq 129.5 \text{ nm}; \quad \text{Expression (4)}$$

Requirement (C): Under assumption that when the circularly polarizing plate is observed from a side of the polarizing film, counter-clockwise rotation is indicated by a positive angular value, based on an in-plane slow axis (0°) of the second optically anisotropic layer, the in-plane slow axis in a surface, which is on a side of the second optically anisotropic layer, of the first optically anisotropic layer is within a range of 13.6±10°, and the liquid crystal compound in the first optically anisotropic layer forms a counter-clockwise helix; and Requirement (D): Under assumption that when the circularly polarizing plate is observed from the side of the polarizing film, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of −13.6±10°, and the liquid crystal compound in the first optically anisotropic layer forms a clockwise helix.

(3) The circularly polarizing plate according to (1) or (2), wherein the liquid crystal compound is a discotic liquid crystal compound or a rod-like liquid crystal compound.

(4) A retardation plate for a circularly polarizing plate comprising a first optically anisotropic layer and a second optically anisotropic layer, and satisfying a following requirement (E) or (F), wherein the first optically anisotropic layer contains a twisted aligned liquid crystal compound of which a helical axis is a thickness direction of the first optically anisotropic layer, a helix angle of the liquid crystal compound in the first optically anisotropic layer is 28.6±10°, a value of Δnd, which is a product of a refractive index anisotropy Δn of the first optically anisotropic layer measured at a wavelength of 550 nm and a thickness d of the first optically anisotropic layer, satisfies a following Expression (1), and ReB(550), which is a value of retardation of the second optically anisotropic layer measured at a wavelength of 550 nm, satisfies a following Expression (2):

$$256 \text{ nm} \leq \Delta nd \leq 316 \text{ nm}; \quad \text{Expression (1)}$$

$$67.5 \text{ nm} \leq ReB(550) \leq 127.5 \text{ nm}; \quad \text{Expression (2)}$$

Requirement (E): Under assumption that when the retardation plate for a circularly polarizing plate is observed from a side of the first optically anisotropic layer, counter-clockwise rotation is indicated by a positive angular value, based on an in-plane slow axis (0°) of the second optically anisotropic layer, the in-plane slow axis in a surface, which is on a side of the second optically anisotropic layer, of the first optically anisotropic layer is within a range of 33.6±10°, and the liquid crystal compound in the first optically anisotropic layer forms a counter-clockwise helix; and Requirement (F): Under assumption that when the retardation plate for a circularly polarizing plate is observed from the side of the first optically anisotropic layer, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of −33.6±10°, and the liquid crystal compound in the first optically anisotropic layer forms a clockwise helix.

(5) A retardation plate for a circularly polarizing plate comprising a first optically anisotropic layer and a second optically anisotropic layer, and satisfying a following requirement (G) or (H), wherein the first optically anisotropic layer contains a twisted aligned liquid crystal compound of which a helical axis is a thickness direction of the first optically anisotropic layer, a helix angle of the liquid crystal compound in the first optically anisotropic layer is 23.9±10°, a value of Δnd, which is a product of a refractive index anisotropy Δn of the first optically anisotropic layer measured at a wavelength of 550 nm and a thickness d of the first optically anisotropic layer, satisfies a following Expression (3), and ReB(550), which is a value of retardation of the second optically anisotropic layer measured at a wavelength of 550 nm, satisfies a following Expression (4):

$$241 \text{ nm} \leq \Delta nd \leq 301 \text{ nm}; \quad \text{Expression (3)}$$

$$69.5 \text{ nm} \leq ReB(550) \leq 129.5 \text{ nm}; \quad \text{Expression (4)}$$

Requirement (G): Under assumption that when the retardation plate for a circularly polarizing plate is observed from a side of the first optically anisotropic layer, counter-clockwise rotation is indicated by a positive angular value, based on an in-plane slow axis (0°) of the second optically anisotropic layer, the in-plane slow axis in a surface, which is on a side of the second optically anisotropic layer, of the first optically anisotropic layer is within a range of 13.6±10°, and the liquid crystal compound in the first optically anisotropic layer forms a counter-clockwise helix; and Requirement (H): Under assumption that when the retardation plate for a circularly polarizing plate is observed from the side of the first optically anisotropic layer, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of −13.6±10°, and the liquid crystal compound in the first optically anisotropic layer forms a clockwise helix.

(6) The retardation plate for a circularly polarizing plate according to (4) or (5), wherein the liquid crystal compound is a discotic liquid crystal compound or a rod-like liquid crystal compound.

(7) An organic electroluminescence display apparatus comprising:

the circularly polarizing plate according to any one of (1) to (3), or the retardation plate for a circularly polarizing plate according to any one of (4) to (6).

According to the present invention, it is possible to provide a circularly polarizing plate which can sufficiently suppress the mixing of black with other colors in a front direction when being stuck on a display apparatus.

Moreover, according to the present invention, it is possible to provide a retardation plate used for the circularly polarizing plate and an organic EL display apparatus that have the circularly polarizing plate.

BRIEF DESCRIPTION OF THE DRAWINGS

FIG. 4A is a perspective view of the circularly polarizing plate, and FIG. 4B is a schematic view showing an angular relationship between the absorption axis of the polarizing film 18 and the in-plane slow axis of each of the first optically anisotropic layer 12a and the second optically anisotropic layer 14a that is found when the circularly polarizing plate is observed in the direction of the white arrow of FIG. 4A.

FIG. 5A is a perspective view of the circularly polarizing plate, and FIG. 5B is a schematic view showing an angular relationship between the absorption axis of the polarizing film 18 and the in-plane slow axis of each of the first optically anisotropic layer 12a and the second optically anisotropic layer 14a that is found when the circularly polarizing plate is observed in the direction of the white arrow of FIG. 5A.

FIG. 7A is a perspective view of the circularly polarizing plate, and FIG. 7B is a schematic view showing an angular relationship between the absorption axis of the polarizing film 18 and the in-plane slow axis of each of the first optically anisotropic layer 12b and the second optically anisotropic layer 14b that is found when the circularly polarizing plate is observed in the direction of the white arrow of FIG. 7A.

FIG. 8A is a perspective view of the circularly polarizing plate, and FIG. 8B is a schematic view showing an angular relationship between the absorption axis of the polarizing film 18 and the in-plane slow axis of each of the first optically anisotropic layer 12b and the second optically anisotropic layer 14b that is found when the circularly polarizing plate is observed in the direction of the white arrow of FIG. 8A.

DETAILED DESCRIPTION OF THE INVENTION

Figure 1:
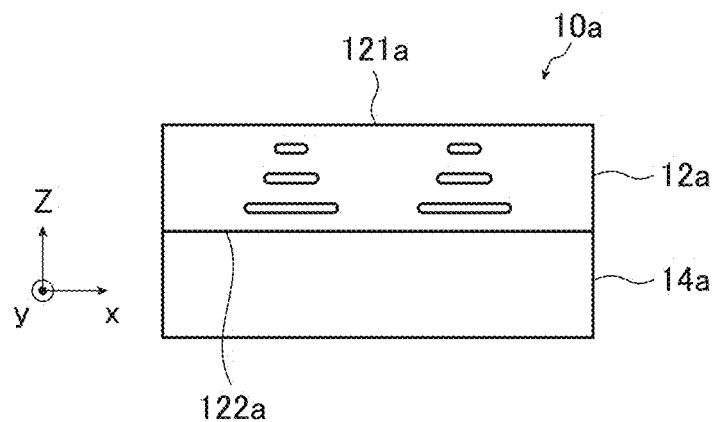
FIG. 1 is an example of a schematic cross-sectional view of a first embodiment of a retardation plate for a circularly polarizing plate of the present invention.

Hereinafter, the present invention will be described in detail. In the present specification, a range of numerical values that is indicated using "to" means a range in which numerical values before and after "to" are included therein as a lower limit and an upper limits. First, terms used in the present specification will be described.

$Re(\lambda)$ represents the in-plane retardation at a wavelength $\lambda$, and $Rth(\lambda)$ represents the retardation in a thickness direction respectively. $Re(\lambda)$, $Rth(\lambda)$, and $\Delta nd$ are measured by an AXOSCAN (manufactured by Axometrics, Inc.).

In the present specification, "visible light" refers to light having a wavelength of 380 nm to 780 nm. Moreover, in the present specification, the measurement wavelength is 550 nm unless otherwise specified.

In addition, in the present specification, the angular relationship ("orthogonal" or "parallel") includes a margin of error allowable in the technical field to which the present invention belongs. Specifically, the margin of error is within a range of less than ±10° in terms of a precise angle. A difference between the precise angle and the angle in the angular relationship is preferably equal to or less than 5° and more preferably equal to or less than 3°.

Hereinafter, preferred embodiments of the retardation plate for a circularly polarizing plate of the present invention will be specifically described.

One of the characteristics of the present invention is that the retardation plate for a circularly polarizing plate is a multi-layered retardation plate including an optically anisotropic layer (hereinafter, referred to as a first optically anisotropic layer) containing a twisted aligned liquid crystal compound. More specifically, by controlling $\Delta nd$ of the first optically anisotropic layer, a helix angle of the liquid crystal compound, and the retardation of the second optically anisotropic layer having an in-plane slow axis that has a predetermined relationship with an in-plane slow axis of the first optically anisotropic layer, it is possible to realize a broadband $\lambda/4$ plate that can convert linearly polarized light of a broader range of wavelengths into a more completely circularly polarized light, compared to a known retardation plate composed of a $\lambda/4$ plate and a $\lambda/2$ plate.

At the time of manufacturing a retardation film (retardation plate), the in-plane slow axis thereof is generally parallel or perpendicular to the transport direction. This is because, at the time of generating retardation, the film is stretched in a direction that is parallel or perpendicular to the transport direction in many cases. For the same reason, also at the time of manufacturing a polarizing film, the absorption axis thereof is generally parallel or perpendicular to the transport direction. Therefore, in the constitution of the present invention, a manufacturing method of a general retardation film and a general polarizing film can be adopted as is, and simply by using a general retardation film as a support and coating the support with one layer of helical liquid crystal, it is possible to realize a high-quality broadband λ/4 plate which can be easily manufactured and does not easily become defective.

First Embodiment

Hereinafter, a first embodiment of the retardation plate for a circularly polarizing plate (hereinafter, simply referred to as a "retardation plate" in some cases) of the present invention will be described with reference to a drawing. FIG. 1 is a schematic cross-sectional view of the first embodiment of the retardation plate of the present invention.

A retardation plate 10a has a first optically anisotropic layer 12a and a second optically anisotropic layer 14a. The first optically anisotropic layer 12a contains a liquid crystal compound LC that is twisted aligned around a helical axis which is in the thickness direction of the layers. Hereinafter, the constitution of each layer will be described in detail.

(First Optically Anisotropic Layer 12a)

As shown in FIG. 1, the first optically anisotropic layer 12a contains the liquid crystal compound LC that is twisted aligned around a helical axis which is in the thickness direction (z-axis direction in FIG. 1) of the layer. It is preferable for the first optically anisotropic layer 12a to exhibit a chiral nematic phase, a cholesteric phase, or the like which has a so-called helical structure. The liquid crystal compound LC will be described later. However, as the liquid crystal compound LC used for the first optically anisotropic layer 12a, liquid crystal compounds exhibiting a nematic liquid crystal phase are preferably used. For forming the aforementioned phase, it is preferable to use a mixture of a liquid crystal compound exhibiting a nematic liquid crystal phase and a chiral agent which will be described later.

The helix angle of the liquid crystal compound LC (helix angle of the liquid crystal compound LC in the alignment direction) is 28.6±10°, and in view of further reducing a degree of the mixing of black with other colors in a front direction that is caused when the circularly polarizing plate of the present invention is stuck to a display apparatus (hereinafter, this will be simply described as "in view of further improving the effects of the present invention" in some cases), the helix angle is more preferably 28.6±8° and even more preferably 28.6±6°.

If the helix angle is less than 18.6° or exceeds 38.6°, when the circularly polarizing plate of the present invention is stuck to a display apparatus, the mixing of black with another color observed in the front direction occurs to a large extent.

The helix angle is measured by an Axoscan apparatus (polarimeter) manufactured by Axometrics, Inc. and by using analytical software attached to the apparatus.

The state in which the liquid crystal compound is twisted aligned means that the liquid crystal compound forms a helix around an axis, which corresponds to the thickness direction of the first optically anisotropic layer 12a, from the main surface on one side of the first optically anisotropic layer 12a to the main surface on the other side thereof. As a result, the alignment direction (direction of the in-plane slow axis) of the liquid crystal compound varies with the position in the thickness direction of the first optically anisotropic layer 12a. That is, in the first optically anisotropic layer 12a, along the thickness direction, the direction of the in-plane slow axis is twisted by the helix angle of the liquid crystal compound.

There are two kinds of helix direction, and the helix may be a right-handed helix or a left-handed helix. In FIG. 1, the right-handed helix refers to a right-handed helix (clockwise helix) that is found when the retardation plate is observed from the first optically anisotropic layer 12a toward the second optically anisotropic layer 14a.

The value of Δnd, which is a product of a refractive index anisotropy Δn of the first optically anisotropic layer 12a (the liquid crystal compound of the first optically anisotropic layer 12a) that is measured at a wavelength of 550 nm and a thickness d of the first optically anisotropic layer 12a, satisfies the following Expression (1).

$$256 \text{ nm} \leq \Delta nd \leq 316 \text{ nm} \qquad \text{Expression (1)}$$

Particularly, in view of further improving the effects of the present invention, the value of Δnd preferably satisfies Formula (1A) and more preferably satisfies Formula (1B).

$$266 \text{ nm} \leq \Delta nd \leq 306 \text{ nm} \qquad \text{Formula (1A)}$$

$$276 \text{ nm} \leq \Delta nd \leq 296 \text{ nm} \qquad \text{Formula (1B)}$$

In a case in which Δnd is less than 256 nm or greater than 316 nm, when the circularly polarizing plate of the present invention is stuck to a display apparatus, the mixing of black with other colors in a front direction occurs to a large extent.

The refractive index anisotropy Δn means the refractive index anisotropy of the optically anisotropic layer.

As the measurement of the helix angle, the measurement Δnd is performed by using an Axoscan apparatus (polarimeter) manufactured by Axometrics, Inc. and by using analytical software from the same company.

(Second Optically Anisotropic Layer 14a)

ReB(550), which is a value of retardation (in-plane retardation) of the second optically anisotropic layer 14a measured at a wavelength of 550 nm, satisfies the following Expression (2).

$$67.5 \text{ nm} \leq \text{ReB}(550) \leq 127.5 \text{ nm} \qquad \text{Expression (2)}$$

Particularly, in view of further improving the effects of the present invention, ReB(550) preferably satisfies Expression (2A) and more preferably satisfies Expression (2B).

$$77.5 \text{ nm} \leq \text{ReB}(550) \leq 117.5 \text{ nm} \qquad \text{Expression (2A)}$$

$$87.5 \text{ nm} \leq \text{ReB}(550) \leq 107.5 \text{ nm} \qquad \text{Expression (2B)}$$

In a case in which ReB(550) is less than 67.5 nm or greater than 127.5 nm, when the circularly polarizing plate of the present invention is stuck to a display apparatus, the mixing of black with other colors in a front direction occurs to a large extent.

As the measurement of the helix angle, the measurement of ReB(550) is performed by using an Axoscan apparatus (polarimeter) manufactured by Axometrics, Inc. and by using analytical software from the same company.

The value of retardation (Rth(550)) in the thickness direction of the second optically anisotropic layer 14a at a wavelength of 550 nm is not particularly limited. However, because a difference in visibility between a front direction and an oblique direction is further reduced when the circularly polarizing plate is stuck to a display apparatus, Rth(550) is preferably −110 nm to 110 nm and more preferably −80 nm to 80 nm.

The material constituting the second optically anisotropic layer 14a is not particularly limited as long as the second optically anisotropic layer 14a has the aforementioned value of retardation. For example, the second optically anisotropic layer 14a may contain a homogeneously aligned liquid crystal compound or may be formed of a polymer film (particularly, a polymer film having undergone stretching processing). The details of the liquid crystal compound will be described later.

As materials for forming the second optically anisotropic layer 14a, polymers having excellent optical transparency, mechanical strength, thermal stability, moisture shielding properties, isotropy, and the like are preferable. That is, as the materials, so-called transparent substrates (transparent resin substrates) are preferable. The word "transparent" means that a visible light transmittance is 60% or higher. The visible light transmittance is preferably 80% or higher and particularly preferably 90% or higher.

Examples of polymer films usable as the second optically anisotropic layer 14a include cellulose acylate films (for example, cellulose triacetate films (refractive index of 1.48), cellulose diacetate films, cellulose acetate butyrate films, and cellulose acetate propionate films), polyolefin films such as polyethylene films and polypropylene films, polyester-based resin films such as polyethylene terephthalate films and polyethylene naphthalate films, polyacrylic resin films such as polyether sulfone films and polymethyl methacrylate films, polyurethane-based resin films, polyester films, polycarbonate films, polysulfone films, polyether films, polymethyl pentene films, polyether ketone films, (meth)acryl nitrile films, films of polymers having an alicyclic structure (norbornene-based resin (ARTON: trade name, manufactured by JSR Corporation, amorphous polyolefin (ZEONEX: trade name, manufactured by ZEON CORPORATION), and the like.

Among these, as materials of polymer film, triacetyl cellulose, polyethylene terephthalate, or polymers having an alicyclic structure is preferable, and triacetyl cellulose is particularly preferable.

The thickness of the second optically anisotropic layer 14a is not particularly limited, and it is preferable to use a second optically anisotropic layer 14a having a thickness of about 10 μm to 200 μm. The thickness is more preferably 10 μm to 100 μm, and even more preferably 20 μm to 90 μm. Moreover, the second optically anisotropic layer 14a may be a laminate composed of plural layers. In order to suppress the reflection of external light, a thin second optically anisotropic layer 14a is preferable. However, if the second optically anisotropic layer 14a is thicker than 10 μm, this is preferable since the film strength is heightened.

When the second optically anisotropic layer 14a contains a polymer, various additives (for example, an optical anisotropy regulator, a wavelength dispersion regulator, fine particles, a plasticizer, a UV inhibitor, deterioration inhibitor, and a release agent) can be added to the second optically anisotropic layer 14a. Moreover, when the second optically anisotropic layer 14a is a cellulose acylate film, the additives may be added at any stage of a dope preparation step (preparation step of a cellulose acylate solution), and a step of adding the additives may be performed at the final stage of the dope preparation step.

In the retardation plate for a circularly polarizing plate, the first optically anisotropic layer 12a and the second optically anisotropic layer 14a are disposed such that the following requirement (E) or (F) is satisfied. The requirements (E) and (F) have substantially the same definition as that of requirements (A) and (B), which will be described later, respectively. Therefore, the details thereof will be comprehensively described later.

Requirement (E): Under assumption that when the retardation plate for a circularly polarizing plate is observed from the side of the first optically anisotropic layer, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of 33.6±10°, and the liquid crystal compound in the first optically anisotropic layer forms a counter-clockwise helix.

Requirement (F): Under assumption that when the retardation plate for a circularly polarizing plate is observed from the side of the first optically anisotropic layer, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of −33.6±10°, and the liquid crystal compound in the first optically anisotropic layer forms a clockwise helix.

Regarding the direction of the helix, the retardation plate for a circularly polarizing plate is observed from the side of the first optically anisotropic layer 12a, and based on the in-plane slow axis in a surface, which is on the observer's side (the side opposite to the second optically anisotropic layer 14a), of the first optically anisotropic layer 12a, whether the helix is a right-handed (clockwise) helix or a left-handed (counter-clockwise) helix is determined.

The angle formed between the in-plane slow axis in a surface 121a, which is on the side opposite to the second optically anisotropic layer 14a, of the first optically anisotropic layer 12a and the in-plane slow axis of the second optically anisotropic layer 14a is preferably 0° to 18°. In view of further improving the effects of the present invention, the angle is more preferably 2° to 14° and even more preferably 6° to 10°.

Furthermore, the angle formed between the in-plane slow axis in a surface 122a, which is on the side of the second optically anisotropic layer 14a, of the first optically anisotropic layer 12a and the in-plane slow axis of the second optically anisotropic layer 14a is preferably 36.6±10°. In view of further improving the effects of the present invention, the angle is more preferably 36.6±8° and even more preferably 36.6±6°.

As the measurement of the helix angle, the measurement of the angle formed between the in-plane slow axis (surface slow axis) in the surfaces 121a and 122a of the first optically anisotropic layer 12a and the in-plane slow axis of the second optically anisotropic layer is performed by using an Axoscan apparatus (polarimeter) manufactured by Axometrics, Inc. and by using analytical software from the same company.

The alignment film, which will be described later, may be disposed between the first and second optically anisotropic layers 12a and 14a. However, as shown in FIG. 1, it is preferable that the first and second optically anisotropic layers 12a and 14a be adjacent to each other and substantially not have the alignment film therebetween. When the first and second optically anisotropic layers 12a and 14a substantially do not have the alignment film therebetween, covalent bonds between compounds contained in each of the optically anisotropic layers can be used, hence the adhesiveness becomes better.

In the present specification, the state in which "substantially do not have the alignment film" means that the optically anisotropic layers do not have a film which is formed only for functioning as an alignment film. Accordingly, the present invention also includes a case where the surface of a layer placed in the lower part contributes to the alignment of the liquid crystal compound of the layer placed in the upper part, as long as the layer placed in the lower part is not a layer formed only for being used as an alignment film.

The type of the liquid crystal compound used for forming the first or second optically anisotropic layer 12a or 14a is not particularly limited. For example, it is possible to use an optically anisotropic layer, which is obtained by forming nematic alignment of low-molecular weight liquid crystalline compound in a liquid crystalline state and then fixing the alignment by photocrosslinking or thermal crosslinking, or an optically anisotropic layer, which is obtained by forming nematic alignment of polymeric liquid crystalline compound in a liquid crystalline state and then fixing the alignment by cooling.

Generally, liquid crystal compounds are classified into rod types (rod-like liquid crystal compounds) and disk types (discotic liquid crystal compounds) according to their shape, and further classified into low-molecular weight types and polymer types. A polymer refers to a compound having a degree of polymerization of 100 or higher in general (Polymer physics•Phase Transition Dynamics, Masao DOI, p. 2, Iwanami Shoten, Publishers., 1992). In the present invention, any of the liquid crystal compounds can be used. However, it is preferable to use rod-like liquid crystal compounds or discotic liquid crystal compounds. Moreover, two or more kinds of rod-like liquid crystal compounds, two or more kinds of discotic liquid crystal compounds, or a mixture of a rod-like liquid crystal compound and a discotic liquid crystal compound may be used.

As the rod-like liquid crystal compound, for example, those described in Claim 1 of JP 11-513019 A or paragraphs [0026] to [0098] of JP 2005-289980 A can be preferably used. As the discotic liquid crystal compound, for example those described in paragraphs [0020] to [0067] of JP 2007-108732 A or paragraphs [0013] to [0108] of JP 2010-24403 A can be preferably used. However, the present invention is not limited to these.

It is more preferable for the first optically anisotropic layer 12a to be formed of the rod-like liquid crystal compound or the discotic liquid crystal compound having polymerizable groups, since the change in temperature or humidity thereof can be reduced. The liquid crystal compound may be a mixture of two or more kinds thereof, and in this case, at least one of the liquid crystal compounds has two or more polymerizable groups.

That is, the first optically anisotropic layer 12a is preferably a layer formed of the rod-like liquid crystal compound or the discotic liquid crystal compound that has polymerizable groups and is fixed by polymerization or the like. In this case, the formed layer does not need to exhibit liquid crystallinity.

The type of the polymerizable groups contained in the discotic liquid crystal compound and the rod-like liquid crystal compound is not particularly limited. The polymerizable groups are preferably functional groups that can cause an addition polymerization reaction, or preferably ethylnically unsaturated polymerizable groups or cyclic polymerizable groups. More specifically, examples thereof include (meth)acryloyl groups, vinyl groups, styryl groups, allyl groups, and the like, and among these, (meth)acryloyl groups are more preferable.

The retardation plate of the present invention can be prepared by various methods, and an example thereof is as follows.

First, a second optically anisotropic layer exhibiting a predetermined retardation value is prepared, and then an alignment film is optionally formed on the second optically anisotropic layer. The surface of the second optically anisotropic layer or the surface of the alignment film is coated with a composition for forming a first optically anisotropic layer that contains a liquid crystal compound having polymerizable groups and contains additives such as a chiral agent as desired, whereby a coating film is formed. The coating film is heated as desired such that the molecules of liquid crystal compound contained in the coating film are twisted aligned, and then the resultant is cooled to the temperature for solidifying the resultant. Then the resultant is subjected to polymerization by curing processing (UV irradiation (light irradiation processing) or heating processing) to fix the helix alignment, whereby a first optically anisotropic layer having optical rotation is obtained. The coating of the liquid crystal composition can be performed by conducting coating of coating liquid of the liquid crystal compound composition containing a solvent, which will be described later, by means of known methods (for example, a wire bar coating method, an extrusion coating method, a direct gravure coating method, a reverse gravure coating method, and die coating method). Moreover, the first optically anisotropic layer may be formed by ejecting the coating liquid by using an inkjet apparatus.

[Polymerization Initiator]

It is preferable for the aligned (preferably vertically aligned) liquid crystal compound to be fixed while maintaining the aligned state. It is preferable for the liquid crystal compound to be fixed by a polymerization reaction of the polymerizable groups introduced to the liquid crystal compound by using a polymerization initiator. The polymerization reaction includes a thermal polymerization reaction using a thermal polymerization initiator and a photopolymerization reaction using a photopolymerization initiator. Particularly, a photopolymerization reaction is preferable.

The amount of the polymerization initiator used is preferably 0.01% by mass to 20% by mass and more preferably 0.5% by mass to 5% by mass of solid contents of the composition.

[Chiral Agent]

At the time forming the first optically anisotropic layer 12a, a chiral agent may be optionally used as desired together with the above liquid crystal compound. The chiral agent is added to helically align the liquid crystal compound. Needless to say, when the liquid crystal compound is an optically active compound such as a compound having chiral carbon in the molecule, the addition of the chiral agent is not necessary. Moreover, depending on the production method and the helix angle, the addition of the chiral agent is not necessary.

The chiral agent is not particularly limited in terms of the structure, as long as the chiral agent is compatible with the liquid crystal compound used concurrently. It is possible to use any of known chiral agents (for example, those described in "Liquid Crystal Device Handbook" edited by the 142$^{nd}$ committee of Japan Society for the Promotion of Science, Chapter 3, Section 4-3, Chiral agents for TN and STN, p. 199, 1989). The chiral agent generally contains chiral carbon atoms. However, axially asymmetric compounds or planar asymmetric compounds not containing chiral carbon atoms can also be used as the chiral agent. Examples of the axially asymmetric compounds or planar asymmetric compounds include binaphthyl, helicene, paracyclophane, and derivatives of these. Moreover, the chiral agent may have liquid crystallinity.

[Other Additives for Optically Anisotropic Layer]

The above liquid crystal compound can be concurrently used with a plasticizer, a surfactant, a polymerizable monomer, and the like to improve uniformity of the coating film, film strength, alignment properties of the liquid crystal compound, and the like. It is preferable for those materials used concurrently to be compatible with the liquid crystal compound and not to hinder the alignment.

Moreover, in order to horizontally or vertically align the liquid crystal compound, an additive (alignment control agent) for promoting the horizontal or vertical alignment may be used. As the additive, various known materials can be used.

Examples of the polymerizable monomer include radically polymerizable monomers and cationically polymerizable monomers. Among these, radically polymerizable polyfunctional monomers that can be copolymerized with the aforementioned polymerizable group-containing liquid crystal compounds are preferable. Examples thereof include those described in paragraphs [0018] to [0020] in JP 2002-296423 A. The amount of the above compounds added is generally in a range of 1% by mass to 50% by mass, and preferably in a range of 5% by mass to 30% by mass, based on the liquid crystalline molecules.

Examples of the surfactant include conventionally known compounds, and among these, fluorine-based compounds are particularly preferable. Specific examples thereof include compounds described in paragraphs [0028] to [0056] of JP 2001-330725 A and paragraphs [0069] to [0126] in Japanese Patent Application No. 2003-295212.

It is preferable for the polymer used concurrently with the liquid crystal compound to be able to thicken the coating liquid. Examples of the polymer include cellulose esters. Preferable examples of the cellulose esters include those described in a paragraph [0178] of JP 2000-155216 A. The amount of the polymer added is preferably in a range of 0.1% by mass to 10% by mass, and more preferably in a range of 0.1% by mass to 8% by mass, based on the liquid crystalline molecules, such that the alignment of the liquid crystal compound is not hindered.

The discotic nematic liquid crystal phase-solid phase transition temperature of the liquid crystal compound is preferably 70° C. to 300° C. and more preferably 70° C. to 170° C.

[Coating Solvent]

As the solvent used for preparing the composition (coating liquid), organic solvents are preferably used. Examples of the organic solvents include amide (for example, N,N-dimethylformamide), sulfoxide (for example, dimethyl sulfoxide), heterocyclic compounds (for example, pyridine), hydrocarbon (for example, benzene and hexane), alkyl halide (for example, chloroform and dichloromethane), ester (for example, methyl acetate, ethyl acetate, and butyl acetate), ketone (for example, acetone and methyl ethyl ketone), and ether (for example, tetrahydrofuran and 1,2-dimethoxyethane). Among these, alkyl halide and ketone are preferable. Two or more kinds of organic solvents may be concurrently used.

[Alignment Film]

In the present invention, the composition for forming the first optically anisotropic layer or the composition for forming the second optically anisotropic layer may be applied to the surface of an alignment film to align molecules of the liquid crystal compound (for example, a discotic liquid crystal compound). The alignment film functions to determine the alignment direction of the liquid crystal compound. Accordingly, it is preferable for the alignment film to be used to realize preferable modes of the present invention. However, if the alignment state of the liquid crystal compound is fixed after the compound is aligned, the role of the alignment film is not required. Therefore, the alignment film is not an essential constituent of the present invention.

The alignment film can be provided by means of rubbing processing of an organic compound (preferably a polymer), oblique deposition of an inorganic compound, formation of a layer having microgrooves, or accumulation of organic compounds (for example, ω-tricosanoic acid, dioctadecyl methyl ammonium chloride, and methyl stearate) by the Langmuir-Blodgett method (LB method). Moreover, an alignment film which obtains an aligning function by being provided with electric or magnetic field or being irradiated with light (preferably polarized light) is known.

It is preferable for the alignment film to be formed by rubbing processing of a polymer.

Examples of the polymer include the polymers described in a paragraph [0022] of JP 8-338913 A such as methacrylate-based copolymers, styrene-based copolymers, polyolefin, polyvinyl alcohol, modified polyvinyl alcohol, poly(N-methylolacrylamide), polyester, polyimide, vinyl acetate copolymers, carboxymethyl cellulose, polycarbonate, and the like. Silane coupling agents can be used as the polymer. Among these, water-soluble polymers (for example, poly(N-methylolacrylamide), carboxymethyl cellulose, gelatin, polyvinyl alcohol, and modified polyvinyl alcohol) are preferable, gelatin, polyvinyl alcohol, and modified polyvinyl alcohol are more preferable, and polyvinyl alcohol and modified polyvinyl alcohol are most preferable.

Basically, the alignment film can be formed by coating the surface of a transparent support with a solution, which contains the aforementioned polymer as a material for forming the alignment film and any additive (for example, a crosslinking agent), then drying (crosslinking) the resultant by heating, followed by rubbing processing.

As the rubbing processing, it is possible to use a processing method that is widely used as liquid crystal alignment process of LCD. That is, it is possible to use a method in which the surface of the alignment film is rubbed with paper, gauze, felt, rubber, nylon, polyester fiber, and the like in a certain direction to obtain the aligning function. Usually, the rubbing processing is performed by rubbing about several times the alignment film with cloth or the like in which fibers having the uniform length and thickness are evenly implanted.

Second Embodiment

Figure 2:
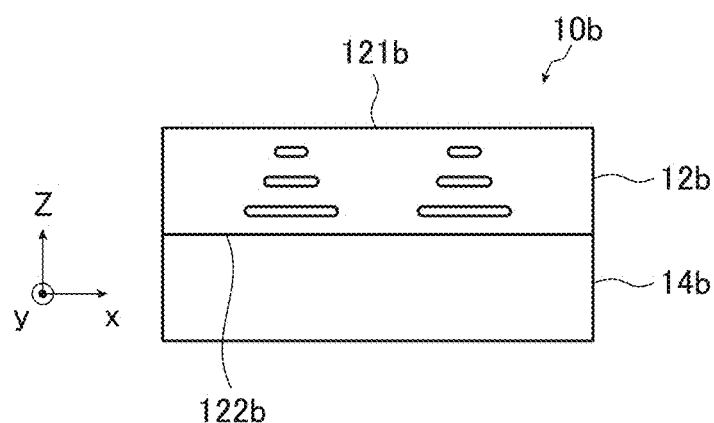
FIG. 2 is an example of a schematic cross-sectional view of a second embodiment of the retardation plate for a circularly polarizing plate of the present invention.

Hereinafter, a second embodiment of the retardation plate for a circularly polarizing plate (hereinafter, simply referred to as a "retardation plate" in some cases) of the present invention will be described with reference to a drawing. FIG. 2 is a schematic cross-sectional view of the second embodiment of the retardation plate of the present invention.

A retardation plate 10b has a first optically anisotropic layer 12b and a second optically anisotropic layer 14b. The first optically anisotropic layer 12b contains the liquid crystal compound LC that is twisted aligned around a helical axis which is in the thickness direction of the layers.

As the retardation plate 10a, the retardation plate 10b is constituted with two optically anisotropic layers. However, it differs from the retardation plate 10a in terms of the retardation of the optically anisotropic layer, the helix angle of the liquid crystal compound, and the like.

Hereinafter, the constitution of each layer will be described in detail.

(First Optically Anisotropic Layer 12b)

As the first optically anisotropic layer 12a shown in FIG. 1, the first optically anisotropic layer 12b contains the liquid crystal compound LC that is twisted aligned around a helical axis which is in the thickness direction (z-axis direction in FIG. 2) of the layer. The preferable embodiment of the liquid crystal compound LC is as described above.

The helix angle of the liquid crystal compound LC is 23.9±10°, and in view of further improving the effects of the present invention, the helix angle is more preferably 23.9±8° and even more preferably 23.9°±6°.

If the helix angle is less than 13.9° or exceeds 33.9°, when the retardation plate of the present invention is stuck as a circularly polarizing plate to a display apparatus, the mixing of black with other colors in a front direction occurs to a large extent.

The helix angle is measured by the method described above.

There are two kinds of helix direction, and the helix may be a right-handed helix or a left-handed helix. In FIG. 2, the right-handed helix refers to a right-handed helix (clockwise helix) that is found when the retardation plate is observed from the first optically anisotropic layer 12b toward the second optically anisotropic layer 14b.

The value of Δnd which is a product of a refractive index anisotropy Δn of the first optically anisotropic layer 12b (the liquid crystal compound of the first optically anisotropic layer 12b) measured at a wavelength of 550 nm and a thickness d of the first optically anisotropic layer 12b satisfies the following Expression (3).

$$241 \text{ nm} \leq \Delta nd \leq 301 \text{ nm} \quad \text{Expression (3)}$$

Particularly, in view of further improving the effects of the present invention, the value of Δnd preferably satisfies Expression (3A) and more preferably satisfies Expression (3B).

$$251 \text{ nm} \leq \Delta nd \leq 291 \text{ nm} \quad \text{Expression (3A)}$$

$$261 \text{ nm} \leq \Delta nd \leq 281 \text{ nm} \quad \text{Expression (3B)}$$

In a case in which Δnd is less than 241 nm and greater than 301 nm, when the retardation plate of the present invention is stuck as a circularly polarizing plate to a display apparatus, the mixing of black with other colors in a front direction occurs to a large extent.

Δnd is measured using an Axoscan apparatus (polarimeter) manufactured by Axometrics, Inc. and by using analytical software from the same company.

(Second Optically Anisotropic Layer 14b)

ReB(550), which is a value of retardation of the second optically anisotropic layer 14b measured at a wavelength of 550 nm, satisfies the following Expression (4).

$$69.5 \text{ nm} \leq \text{ReB}(550) \leq 129.5 \text{ nm} \quad \text{Expression (4)}$$

Particularly, in view of further improving the effects of the present invention, ReB(550) preferably satisfies Expression (4A) and more preferably satisfies Expression (4B).

$$79.5 \text{ nm} \leq \text{ReB}(550) \leq 119.5 \text{ nm} \quad \text{Expression (4A)}$$

$$89.5 \text{ nm} \leq \text{ReB}(550) \leq 109.5 \text{ nm} \quad \text{Expression (4B)}$$

In a case in which ReB(550) is less than 69.5 nm and greater than 129.5 nm, when the retardation plate of the present invention is stuck as a circularly polarizing plate to a display apparatus, the mixing of black with other colors in a front direction occurs to a large extent.

ReB(550) is measured using an Axoscan apparatus (polarimeter) manufactured by Axometrics, Inc. and by using analytical software from the same company.

As the second optically anisotropic layer 14a, the material constituting the second optically anisotropic layer 14b is not particularly limited as long as the second optically anisotropic layer 14b has the aforementioned value of retardation. For example, the second optically anisotropic layer 14b may contain a homogeneously aligned liquid crystal compound or may be formed of a polymer film (particularly, a polymer film having undergone stretching processing).

In a retardation plate 10b for a circularly polarizing plate, the first optically anisotropic layer 12b and the second optically anisotropic layer 14b are disposed such that the following requirement (G) or (H) is satisfied. The requirements (G) and (H) have substantially the same definition as that of requirements (C) and (D), which will be described later, respectively. Therefore, the details thereof will be comprehensively described later.

Requirement (G): Under assumption that when the retardation plate for a circularly polarizing plate is observed from the side of the first optically anisotropic layer, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of 13.6±10°, and the liquid crystal compound in the first optically anisotropic layer forms a counter-clockwise helix.

Requirement (H): Under assumption that when the retardation plate for a circularly polarizing plate is observed from the side of the first optically anisotropic layer, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of −13.6±10°, and the liquid crystal compound in the first optically anisotropic layer forms a clockwise helix.

Regarding the direction of the helix, the retardation plate for a circularly polarizing plate is observed from the side of the first optically anisotropic layer 12b, and based on the in-plane slow axis in a surface, which is on the observer's side (the side opposite to the second optically anisotropic layer 14b), of the first optically anisotropic layer 12b, whether the helix is a right-handed (clockwise) helix or a left-handed (counter-clockwise) helix is determined.

The angle formed between the in-plane slow axis in a surface 121b, which is on the side opposite to the second optically anisotropic layer 14b, of the first optically anisotropic layer 12b and the in-plane slow axis of the second optically anisotropic layer 14b is preferably 10.3±10°. In view of further improving the effects of the present invention, the angle is more preferably 10.3±8° and even more preferably 10.3±6°.

Furthermore, the angle formed between the in-plane slow axis in a surface 122b, which is on the side of the second optically anisotropic layer 14b, of the first optically anisotropic layer 12b and the in-plane slow axis of the second optically anisotropic layer 14b is preferably 13.6±10°. In view of further improving the effects of the present invention, the angle is more preferably 13.6±8° and even more preferably 13.6±6°.

The aforementioned alignment film may be disposed between the first and second optically anisotropic layers 12b and 14b. However, as shown in FIG. 2, it is preferable that the first and second optically anisotropic layers 12b and 14b be adjacent to each other and substantially not have the alignment film therebetween, as the retardation plate 10a.

Examples of materials constituting the first and second optically anisotropic layers 12b and 14b include the aforementioned materials constituting each of the first and second optically anisotropic layers 12a and 14a.

Moreover, the production method of the first and second optically anisotropic layers 12b and 14b is not particularly limited, and examples of the production method include the aforementioned production method of the first and second optically anisotropic layers 12a and 14a.

<Circularly Polarizing Plate>

The circularly polarizing plate of the present invention has at least the aforementioned retardation plate (the first and second embodiments) and a polarizing film. Moreover, the circularly polarizing plate may optionally contain a transparent support.

The circularly polarizing plate of the present invention constituted as above is suitably used for preventing reflection caused in an image display apparatus such as a liquid crystal display (LCD), a plasma display panel (PDP), an electroluminescence display (ELD), or a cathode ray tube (CRT) display apparatus and is for improving a contrast ratio of display light.

For example, there is an embodiment in which the circularly polarizing plate of the present invention is used at the side of light extraction surface of an organic EL display apparatus. In this case, external light becomes linearly-polarized light by the polarizing film and then becomes circularly-polarized light by passing through the retardation plate. When the circularly-polarized light is reflected from a metal electrode, the circularly polarized state is inverted. When the circularly-polarized light passes again through the retardation plate, it becomes linearly polarized light inclining by 90° from the time when the light enters the retardation plate, and reaches and is absorbed by the polarizing film. As a result, the influence of the external light can be suppressed.

First, a member (a polarizing film) used for the circularly polarizing plate will be described, and then specific embodiments of the circular polarizing plate will be described.

[Polarizing Film]

The polarizing film (polarizing layer) may be a member that functions to convert natural light into specific linearly-polarized light, and absorptive polarizer can be used.

The type of the polarizing film is not particularly limited, and generally used polarizing films can be used. For example, it is possible to use any of iodine-based polarizing films, dye-based polarizing films using dichroic dyes, and polyene-based polarizing films. The iodine-based polarizing films and the dye-based polarizing films are generally prepared by causing iodine or dichroic dyes to be adsorbed onto polyvinyl alcohol and stretching the resultant.

The polarizing film is generally used in the form of a polarizing plate obtained by pasting protective films to both sides thereof.

The production method of the circularly polarizing plate is not particularly limited. However, for example, it is preferable for the production method to include a step of continuously laminating a long retardation plate and a long polarizing film on each other. The long polarizing plate is cut so as to match with the size of the screen of an image display apparatus.

Hereinafter, specific embodiments of the circularly polarizing plate will be described in detail.

First Embodiment

Figure 3:
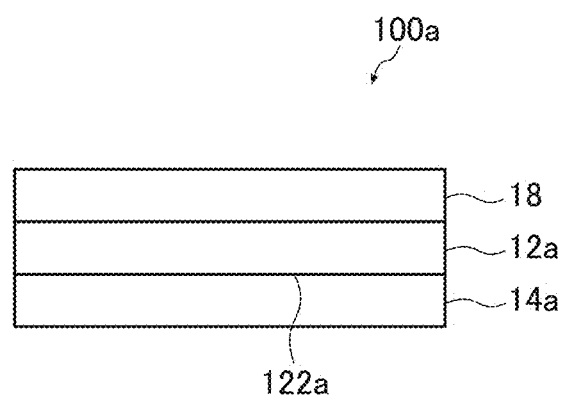
FIG. 3 is an example of a schematic cross-sectional view of a first embodiment of a circularly polarizing plate of the present invention.

As a first embodiment of the circularly polarizing plate, a circularly polarizing plate 100a, which has the polarizing film 18, the first optically anisotropic layer 12a, and the second optically anisotropic layer 14a in this order as shown in FIG. 3, is exemplified In the circularly polarizing plate 100a, the relationship between the absorption axis of the polarizing film 18 and the in-plane slow axis of the second optically anisotropic layer 14a satisfies the following requirement (X) or (Y).

(X) The absorption axis of the polarizing film 18 and the in-plane slow axis of the second optically anisotropic layer 14a are parallel to each other.

(Y) The absorption axis of the polarizing film 18 and the in-plane slow axis of the second optically anisotropic layer 14a are orthogonal to each other.

Figure 4A:
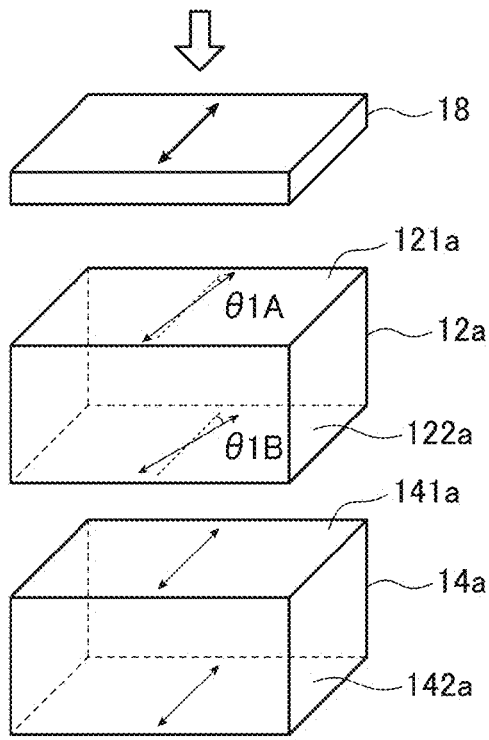
FIGS. 4A and 4B are views showing a relationship (X) between an absorption axis of a polarizing film 18 and an in-plane slow axis of each of a first optically anisotropic layer 12a and a second optically anisotropic layer 14a that is established in an aspect of the first embodiment of the circularly polarizing plate of the present invention.
Figure 4B:
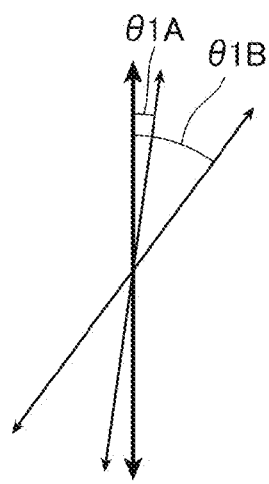

The relationship between the absorption axis of the polarizing film 18, the in-plane slow axis of the first optically anisotropic layer 12a, and the in-plane slow axis of the second optically anisotropic layer 14a that is established in the embodiment represented by the requirement (X) will be specifically described by using FIGS. 4A and 4B.

FIG. 4A is a perspective view of the circularly polarizing plate 100a that satisfies the requirement (X). In FIG. 4A, the arrow in the polarizing film 18 indicates the absorption axis, and the arrow in each of the first optically anisotropic layer 12a and the second optically anisotropic layer 14a indicates the in-plane slow axis in each of the layers. FIG. 4B shows the angular relationship between the absorption axis of the polarizing film 18, the in-plane slow axis of the first optically anisotropic layer 12a, and the in-plane slow axis of the second optically anisotropic layer 14a that is established when the circularly polarizing plate 100a is observed in the direction of the white arrow of FIG. 4A.

Figure 5A:
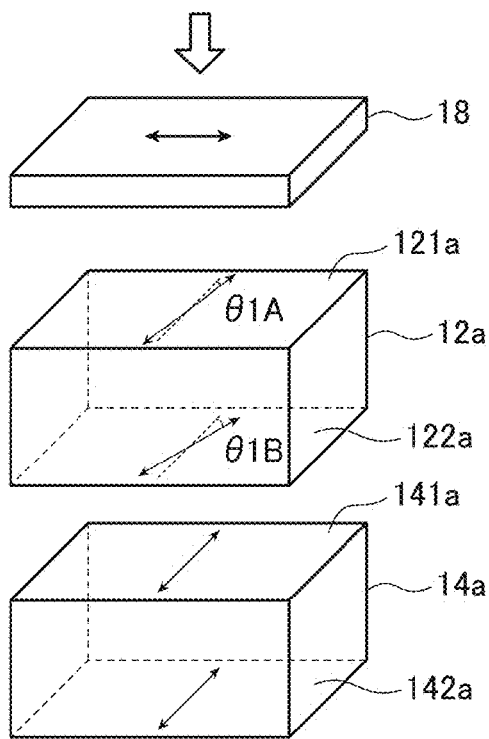
FIGS. 5A and 5B are views showing a relationship (Y) between the absorption axis of the polarizing film 18 and the in-plane slow axis of each of the first optically anisotropic layer 12a and the second optically anisotropic layer 14a that is established in an aspect of the first embodiment of the circularly polarizing plate of the present invention.
Figure 5B:
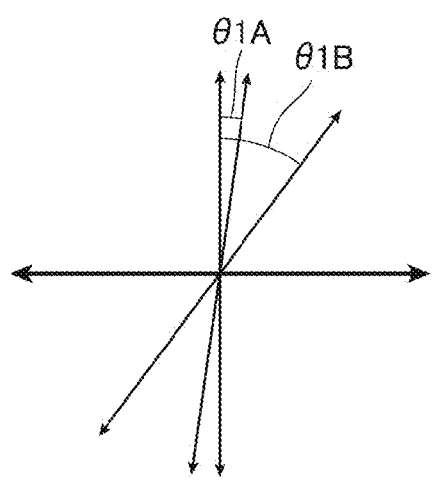

In FIG. 4B, in a case in which the circularly polarizing plate 100a is observed in the direction of the white arrow of FIG. 4A, based on the in-plane slow axis (0°) of the second optically anisotropic layer 14a, a counter-clockwise rotation angle of the in-plane slow axis is indicated by a positive angular value, and a clockwise rotation angle of the in-plane slow axis is indicated by a negative angular value. Furthermore, regarding the direction of the helix, the circularly polarizing plate 100a is observed in the direction of the white arrow of FIG. 4A, and based on the in-plane slow axis in a surface, which is on the observer's side (the side of the polarizing film 18), of the first optically anisotropic layer 12a, whether the helix is a right-handed (clockwise) helix or a left-handed (counter-clockwise) helix is determined. In FIGS. 5A and 5B which will be described later, the direction of the helix is determined based on the same in-plane slow axis as described above.

In FIGS. 4A and 4B, the absorption axis of the polarizing film 18 and the in-plane slow axis of the second optically anisotropic layer 14a are parallel to each other. The definition of parallel is as described above. The second optically anisotropic layer 14a contains a homogenously aligned liquid crystal compound, and the in-plane slow axis in a surface 141a of the second optically anisotropic layer 14a and the in-plane slow axis in a surface 142a of the second optically anisotropic layer 14a are parallel to each other.

In FIGS. 4A and 4B, between the in-plane slow axis of the second optically anisotropic layer 14a and the in-plane slow axis in the surface 121a, which is on the side of the polarizing film 18, of the first optically anisotropic layer 12a, an angle θ1A of 8.0° is formed. That is, the in-plane slow axis in the surface 121a of the first optically anisotropic layer 12a has rotated by −8.0° (8.0° in the clockwise direction) with respect to the in-plane slow axis of the second optically anisotropic layer 14a. FIGS. 4A and 4B show an embodiment in which the in-plane slow axis in the surface 121a of the first optically anisotropic layer 12a is in a position of −8.0°. However, the present invention is not limited thereto, and the in-plane slow axis is preferably within a range of −8.0±10°.

As described above, the first optically anisotropic layer 12a contains a twisted aligned liquid crystal compound of which the helical axis is the thickness direction of the first optically anisotropic layer 12a. Therefore, as shown in FIG. 4A, the in-plane slow axis in the surface 121a, which is on the side of the polarizing film 18, of the first optically anisotropic layer 12a and the in-plane slow axis in the surface 122a, which is on the side of the second optically anisotropic layer 14a, of the first optically anisotropic layer 12a forms the aforementioned helix angle (28.6° in FIGS. 4A and 4B). That is, the in-plane slow axis of the first optically anisotropic layer 12a has rotated by −28.6° (28.6° in the clockwise direction). Accordingly, between the in-plane slow axis of the second optically anisotropic layer 14a and the in-plane slow axis in the surface 122a of the first optically anisotropic layer 12a, an angle θ1B of 33.6° is formed.

FIGS. 4A and 4B show an embodiment in which the in-plane slow axis in the surface 122a of the first optically anisotropic layer 12a has rotated by −28.6° with respect to the in-plane slow axis in the surface 121a of the first optically anisotropic layer 12a. However, the present invention is not limited thereto, and the rotation angle may be within a range of −28.6±10°.

Furthermore, FIGS. 4A and 4B show an embodiment in which the in-plane slow axis in the surface 122a of the first optically anisotropic layer 12a is in a position of −33.6°. However, the present invention is not limited thereto, and the in-plane slow axis may be in a position within a range of −33.6±10°.

As described above, in the embodiment shown in FIG. 4A, based on the in-plane slow axis of the second optically anisotropic layer 14a, the in-plane slow axis in the surface 122a, which is on the side of the second optically anisotropic layer 14a, of the first optically anisotropic layer 12a is in a position of −33.6°, and the liquid crystal compound in the first optically anisotropic layer 12a forms a clockwise (right-handed) helix.

In FIG. 4A, the embodiment in which the liquid crystal compound forms a clockwise helix is specifically described. However, as long as a predetermined angular relationship is satisfied, an embodiment in which the liquid crystal compound forms a counter-clockwise helix may be adopted. More specifically, an embodiment may be adopted in which, based on the in-plane slow axis of the second optically anisotropic layer 14a, the in-plane slow axis in the surface 122a, which is on the side of the second optically anisotropic layer 14a, of the first optically anisotropic layer 12a is in a position of 33.6°, and the liquid crystal compound in the first optically anisotropic layer 12a forms a counter-clockwise (left-handed) helix.

Summarizing the aforementioned embodiments, under assumption that the retardation plate 10a for a circularly polarizing plate is observed from the polarizing film 18, and counter-clockwise rotation is indicated by a positive angular value, based on the in-plane slow axis (0°) of the second optically anisotropic layer 14a, the in-plane slow axis in the surface 122a, which is on the side of the second optically anisotropic layer 14a, of the first optically anisotropic layer 12a may be within a range of 33.6±10°, and the liquid crystal compound in the first optically anisotropic layer 12a may form a counter-clockwise helix (requirement (A)), or alternatively, the in-plane slow axis in the surface 122a, which is on the side of the second optically anisotropic layer 14a, of the first optically anisotropic layer 12a may be within a range of −33.6±10° C., and the liquid crystal compound in the first optically anisotropic layer 12a may form a clockwise helix (requirement (B)).

The direction, in which the retardation plate for a circularly polarizing plate is observed from the first optically anisotropic layer 12a as described in the aforementioned requirements (E) and (F), is the same as the direction of the white arrow shown in FIG. 4A, and the definition thereof is also the same as the definition described in the requirements (A) and (B).

Next, the relationship between the absorption axis of the polarizing film 18, the in-plane slow axis of the first optically anisotropic layer 12a, and the in-plane slow axis of the second optically anisotropic layer 14a that is established in the embodiment represented by the requirement (Y) will be specifically described by using FIGS. 5A and 5B.

FIG. 5A is a perspective view of a circularly polarizing plate 100a that satisfies the requirement (Y). In FIG. 5A, the arrow in the polarizing film 18 indicates the absorption axis, and the arrow in each of the first optically anisotropic layer 12a and the second optically anisotropic layer 14a indicates the in-plane slow axis in each of the layers. FIG. 5B shows the angular relationship between the absorption axis of the polarizing film 18, the in-plane slow axis of the first optically anisotropic layer 12a, and the in-plane slow axis of the second optically anisotropic layer 14a that is found when the circularly polarizing plate 100a is observed in the direction of the white arrow of FIG. 5A.

In FIG. 5B, in a case in which the circularly polarizing plate 100a is observed in the direction of the white arrow of FIG. 5A, based on the absorption axis of the polarizing film 18, the counter-clockwise rotation angle of the in-plane slow axis is indicated by a positive angular value, and the clockwise rotation angle of the in-plane slow axis is indicated by a negative angular value.

The constitution of the embodiment shown in FIGS. 5A and 5B is the same as the constitution of the embodiment shown in FIGS. 4A and 4B, except that there is a difference of 90° between the absorption axis of the polarizing film 18 in FIGS. 5A and 5B and the absorption axis of the polarizing film 18 in FIGS. 4A and 4B. That is, except that the absorption axis of the polarizing film 18 and the in-plane slow axis of the second optically anisotropic layer are orthogonal to each other, the embodiment shown in FIGS. 5A and 5B has the same constitution as the constitution of the embodiment shown in FIGS. 4A and 4B. Furthermore, the relationship between the in-plane slow axis in the first optically anisotropic layer 12a and the in-plane slow axis in the second optically anisotropic layer 14a is as described above. Herein, the definition of orthogonal is as described above.

When the first optically anisotropic layer 12a of the circularly polarizing plate 100a in FIG. 3 contains a discotic liquid crystal compound, in view of further reducing a difference in visibility between a front direction and an oblique direction when the circularly polarizing plate is stuck to a display apparatus, Rth(550) of the second optically anisotropic layer 14a is preferably 30 nm to 50 nm and more preferably 35 nm to 45 nm.

When the first optically anisotropic layer 12a of the circularly polarizing plate 100a in FIG. 3 contains a rod-like liquid crystal compound, in view of further reducing a difference in visibility between a front direction and an oblique direction when the circularly polarizing plate is stuck to a display apparatus, Rth(550) of the second optically anisotropic layer 14a is preferably −110 nm to −90 nm and more preferably −105 nm to −95 nm.

Second Embodiment

Figure 6:
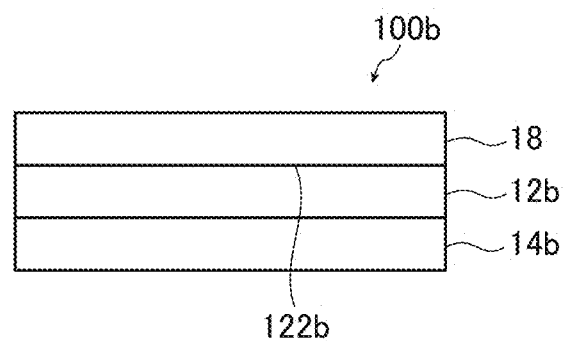
FIG. 6 is an example of a schematic cross-sectional view of a second embodiment of the circularly polarizing plate of the present invention.

As a second embodiment of the circularly polarizing plate, a circularly polarizing plate 100b, which has the polarizing film 18, the first optically anisotropic layer 12b, and the second optically anisotropic layer 14b in this order as shown in FIG. 6, is exemplified In the circularly polarizing plate 100b, the relationship between the absorption axis of the polarizing film 18 and the in-plane slow axis of the second optically anisotropic layer 14b satisfies the following requirement (Z) or (W).

(Z) The absorption axis of the polarizing film 18 and the in-plane slow axis of the second optically anisotropic layer 14b are parallel to each other.

(W) The absorption axis of the polarizing film 18 and the in-plane slow axis of the second optically anisotropic layer 14b are orthogonal to each other.

Figure 7A:
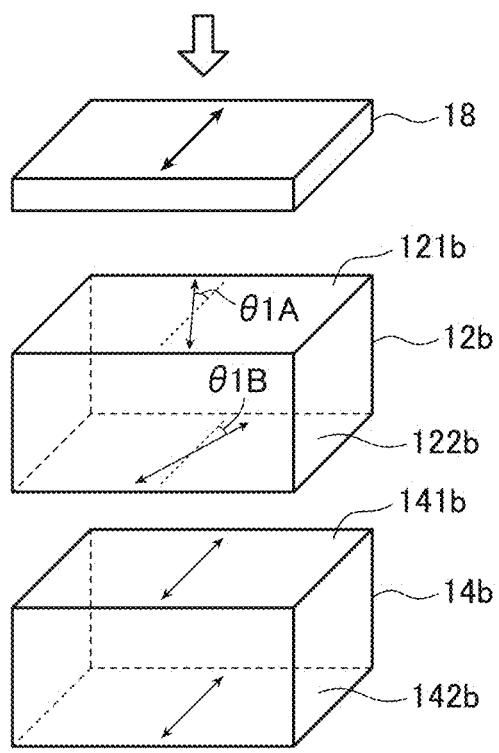
FIGS. 7A and 7B are views showing a relationship (Z) between the absorption axis of the polarizing film 18 and the in-plane slow axis of each of a first optically anisotropic layer 12b and a second optically anisotropic layer 14b that is established in an aspect of the second embodiment of the circularly polarizing plate of the present invention.
Figure 7B:
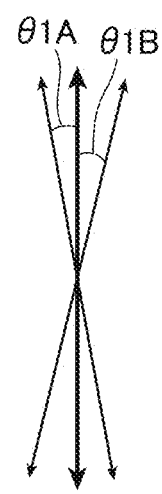

The relationship between the absorption axis of the polarizing film 18, the in-plane slow axis of the first optically anisotropic layer 12b, and the in-plane slow axis of the second optically anisotropic layer 14b that is established in an embodiment represented by the requirement (Z) will be specifically described by using FIGS. 7A and 7B.

FIG. 7A is a perspective view of the circularly polarizing plate 100b that satisfies the requirement (Z). In FIG. 7A, the arrow in the polarizing film 18 indicates the absorption axis, and the arrow in each of the first optically anisotropic layer 12b and the second optically anisotropic layer 14b indicates the in-plane slow axis of each of the layers. FIG. 7B shows the angular relationship between the absorption axis of the polarizing film 18, the in-plane slow axis of the first optically anisotropic layer 12b, and the in-plane slow axis of the second optically anisotropic layer 14b that is found when the circularly polarizing plate 100b is observed in the direction of the white arrow of FIG. 7A.

Figure 8A:
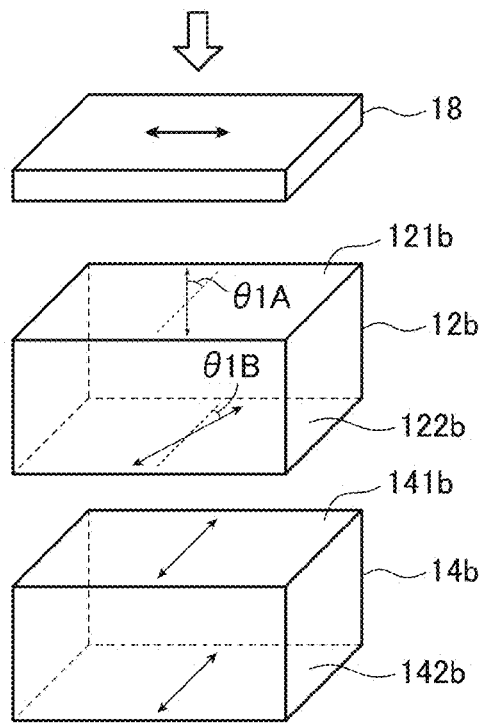
FIGS. 8A and 8B are views showing a relationship (W) between the absorption axis of the polarizing film 18 and the in-plane slow axis of each of the first optically anisotropic layer 12b and the second optically anisotropic layer 14b that is established in an aspect of the second embodiment of the circularly polarizing plate of the present invention.
Figure 8B:
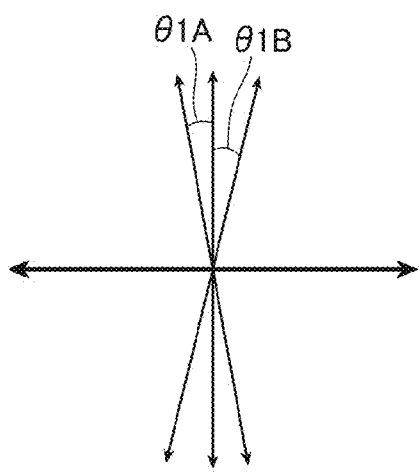

In FIG. 7B, in a case in which the circularly polarizing plate 100b is observed in the direction of the white arrow of FIG. 7A, based on the in-plane slow axis (0°) of the second optically anisotropic layer 14b, the counter-clockwise rotation angle of the in-plane slow axis is indicated by a positive angular value, and the clockwise rotation angle of the in-plane slow axis is indicated by a negative angular value. Furthermore, regarding the direction of the helix, the circularly polarizing plate 100b is observed in the direction of the white arrow of FIG. 7A, and based on the in-plane slow axis in a surface, which is on the observer's side (the side of the polarizing film 18), of the first optically anisotropic layer 12b, whether the helix is a right-handed helix or a left-handed helix is determined. In FIGS. 8A and 8B which will be described later, the direction of the helix is determined based on the same in-plane slow axis as described above.

In FIGS. 7A and 7B, the absorption axis of the polarizing film 18 and the in-plane slow axis (the in-plane slow axis in a surface 141b and a surface 142b) of the second optically anisotropic layer 14b are parallel to each other. The definition of parallel is as described above.

In FIGS. 7A and 7B, between the in-plane slow axis of the second optically anisotropic layer 14b and the in-plane slow axis in the surface 121b, which is on the side of the polarizing film 18, of the first optically anisotropic layer 12b, an angle θ1A of 10.3° is formed. That is, the in-plane slow axis in the surface 121b of the first optically anisotropic layer 12b has rotated by 10.3° (10.3° in the counter-clockwise direction) with respect to the in-plane slow axis of the second optically anisotropic layer 14b. FIGS. 7A and 7B show an embodiment in which the in-plane slow axis in the surface 121b of the first optically anisotropic layer 12b is in a position of 10.3°. However, the present invention is not limited thereto, and the in-plane slow axis is preferably in a position within a range of 10.3±10°.

As described above, the first optically anisotropic layer 12b contains a twisted aligned liquid crystal compound of which the helical axis is the thickness direction of the first optically anisotropic layer 12b. Therefore, as shown in FIG. 7A, the in-plane slow axis in the surface 121b, which is on the side of the polarizing film 18, of the first optically anisotropic layer 12b and the in-plane slow axis in the surface 122b, which is on the side of the second optically anisotropic layer 14b, of the first optically anisotropic layer 12b form the aforementioned helix angle (23.9° in FIGS. 7A and 7B). That is, the in-plane slow axis of the first optically anisotropic layer 12b has rotated by −23.9° (23.9° in the clockwise direction). Accordingly, between the in-plane slow axis of the second optically anisotropic layer 14b and the in-plane slow axis in the surface 122b of the first optically anisotropic layer 12b, an angle θ1B of 13.6° is formed.

FIGS. 7A and 7B show an embodiment in which the in-plane slow axis in the surface 122b of the first optically anisotropic layer 12b has rotated by −23.9° with respect to the in-plane slow axis in the surface 121b of the first optically anisotropic layer 12b.

However, the present invention is not limited to the embodiment, and the rotation angle may be within a range of −23.9±10°.

FIGS. 7A and 7B show an embodiment in which the in-plane slow axis in the surface 122b of the first optically anisotropic layer 12b is in a position of −13.6°. However, the present invention is not limited to the embodiment, and the in-plane slow axis may be within a range of −13.6±10° C.

As described above, in the embodiment shown in FIG. 7A, based on the in-plane slow axis of the second optically anisotropic layer 14b, the in-plane slow axis in the surface 122b, which is on the side of the second optically anisotropic layer 14b, of the first optically anisotropic layer 12b is in a position of −13.6°, and the liquid crystal compound in the first optically anisotropic layer 12b forms a clockwise (right-handed) helix.

In FIG. 7A, the embodiment in which the liquid crystal compound forms a clockwise helix is specifically described. However, as long as a predetermined angular relationship is satisfied, an embodiment may be adopted in which the liquid crystal compound forms a counter-clockwise helix. More specifically, an embodiment may be adopted in which, based on the in-plane slow axis of the second optically anisotropic layer 14b, the in-plane slow axis in the surface 122b, which is on the side of the second optically anisotropic layer 14b, of the first optically anisotropic layer 12b is in a position of 13.6°, and the liquid crystal compound in the first optically anisotropic layer 12b forms a counter-clockwise (left-handed) helix.

Summarizing the aforementioned embodiments, under assumption that the retardation plate 10b for a circularly polarizing plate is observed from the polarizing film 18, and the counter-clockwise rotation is indicated by a positive angular value, based on the in-plane slow axis (0°) of the second optically anisotropic layer 14b, the in-plane slow axis in the surface 122b, which is on the side of the second optically anisotropic layer 14b, of the first optically anisotropic layer 12b may be within a range of 13.6±10°, and the liquid crystal compound in the first optically anisotropic layer 12a may form a counter-clockwise helix (requirement (C)), or alternatively, the in-plane slow axis in the surface 122b, which is on the side of the second optically anisotropic layer 14b, of the first optically anisotropic layer 12b may be within a range of −13.6±10°, and the liquid crystal compound in the first optically anisotropic layer 12b may form a clockwise helix (requirement (D)).

The direction in which the retardation plate for a circularly polarizing plate is observed from the first optically anisotropic layer 12b as described in the aforementioned requirements (G) and (H) is the same as the direction of the white arrow shown in FIG. 7A, and the definition thereof is also the same as the definition described in the requirements (C) and (D).

Next, the relationship between the absorption axis of the polarizing film 18, the in-plane slow axis of the first optically anisotropic layer 12b, and the in-plane slow axis of the second optically anisotropic layer 14b that is established in an embodiment represented by the requirement (W) will be specifically described by using FIGS. 8A and 8B.

FIG. 8A is a perspective view of the circularly polarizing plate 100b that satisfies the requirement (W). In FIG. 8A, the arrow in the polarizing film 18 indicates the absorption axis, and the arrow in each of the first optically anisotropic layer 12b and the second optically anisotropic layer 14b indicates the in-plane slow axis of each of the layers. FIG. 8B shows the angular relationship between the absorption axis of the polarizing film 18, the in-plane slow axis of the first optically anisotropic layer 12b, and the in-plane slow axis of the second optically anisotropic layer 14b that is found when the circularly polarizing plate 100b is observed in the direction of the white arrow of FIG. 8A.

In FIG. 8B, in a case in which the circularly polarizing plate 100b is observed in the direction of the white arrow of FIG. 8A, based on the absorption axis of the polarizing film 18, the counter-clockwise rotation angle of the in-plane slow axis is indicated by a positive angular value, and the clockwise rotation angle of the in-plane slow axis is indicated by a negative angular value.

The constitution of the embodiment shown in FIGS. 8A and 8B is the same as the constitution of the embodiment shown in FIGS. 7A and 7B, except that there is a difference of 90° between the absorption axis of the polarizing film 18 in FIGS. 8A and 8B and the absorption axis of the polarizing film 18 in FIGS. 7A and 7B. That is, except that the absorption axis of the polarizing film 18 and the in-plane slow axis of the second optically anisotropic layer 14b are orthogonal to each other, the embodiment shown in FIGS. 8A and 8B has the same constitution as the constitution of the embodiment in FIGS. 7A and 7B. Furthermore, the relationship between the in-plane slow axis in the first optically anisotropic layer 12b and the in-plane slow axis in the second optically anisotropic layer 14b is as described above. Herein, the definition of orthogonal is as described above.

When the first optically anisotropic layer 12b of the circularly polarizing plate 100b in FIG. 6 contains a discotic liquid crystal compound, in view of further reducing a difference in visibility between a front direction and an oblique direction when the circularly polarizing plate is stuck to a display apparatus, Rth(550) of the second optically anisotropic layer 14b is preferably 70 nm to 90 nm and more preferably 75 nm to 85 nm.

When the first optically anisotropic layer 12b of the circularly polarizing plate 100b in FIG. 6 contains a rod-like liquid crystal compound, in view of further reducing a difference in visibility between a front direction and an oblique direction when the circularly polarizing plate is stuck to a display apparatus, Rth(550) of the second optically anisotropic layer 14b is preferably −50 nm to −30 nm and more preferably −45 nm to −35 nm.

<Organic EL (Electroluminescence) Display Apparatus>

The organic EL display apparatus of the present invention has the aforementioned retardation plate (or the circularly polarizing plate). Generally, the circularly polarizing plate is disposed on an organic EL panel of the organic EL display apparatus. More specifically, as shown in FIG. 9A, an organic EL display apparatus 200 has at least an organic EL panel 20, the retardation plate 10a or 10b, and the polarizing film 18.

Figure 9A:
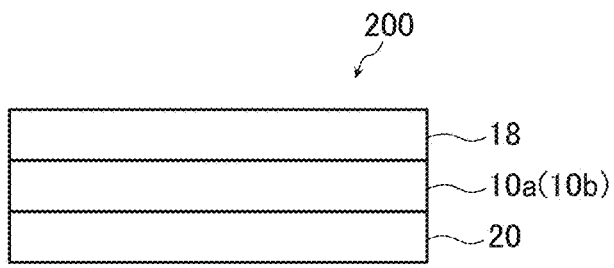
FIGS. 9A and 9B are each an example of a schematic cross-sectional view of an organic EL display apparatus of the present invention and of another organic EL display apparatus of the present invention.
Figure 9B:
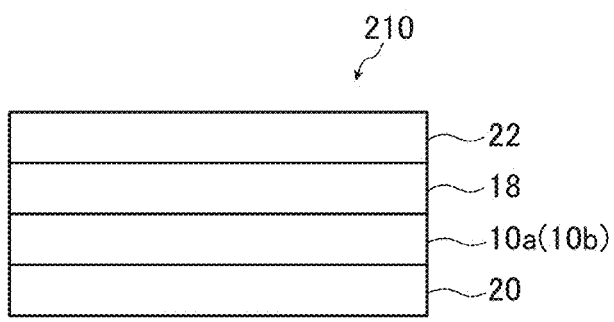

The organic EL display apparatus is not limited to the embodiment shown in FIG. 9A. As shown in FIG. 9B, an organic EL display apparatus 210 may further have a protective film 22 on the polarizing film 18.

The organic EL panel is a member having a structure in which a light emitting layer or plural thin organic compound films including the light emitting layer are formed between a pair of electrodes consisting of an anode and a cathode. The organic EL panel may have a hole injection layer, a hole transport layer, an electron injection layer, an electron transport layer, a protective layer, and the like in addition to the light emitting layer. Moreover, each of these layers may have different functions, and various materials can be used for forming each of the layers.

The anode is for supplying holes to the hole injection layer, the hole transport layer, the light emitting layer, and the like. For the anode, metals, alloys, metal oxides, electroconductive compounds, and mixtures of these can be used, and among these, materials having a work function of 4 eV or higher are preferable. Specific examples thereof include conductive metal oxides such as tin oxide, zinc oxide, indium oxide, and indium tin oxide (ITO); metals such as gold, silver, chromium, and nickel; mixtures or laminates consisting of these metals and conductive metal oxides; inorganic conductive materials such as copper iodide and copper sulfide; organic conductive materials such as polyaniline, polythiophene, and polypyrrole; laminates consisting of the organic conductive materials and ITO; and the like. Among these, conductive metal oxides are preferable, and in view of productivity, a high degree of conductivity, transparency, and the like, ITO is particularly preferable. The film thickness of the anode can be appropriately selected depending on the materials used. However, the thickness is preferably within a range of 10 nm to 5 µm in general, more preferably 50 nm to 1 µm, and even more preferably 100 nm to 500 nm.

EXAMPLES

Hereinafter, the characteristics of the present invention will be described in more detail based on examples and comparative examples. The materials, the amount thereof used, the proportion thereof, the processing method, the processing procedure, and the like described in the following examples can be appropriately modified within a range that does not depart from the gist of the present invention. Accordingly, the scope of the present invention should not be restricted by the following specific examples.

<Preparation of Second Optically Anisotropic Layer (Hereinafter, Simply Referred Also to as a Support)>

(Preparation of Support 1)

The composition described below was put into a mixing tank and stirred while being heated so as to dissolve the respective components, thereby preparing a cellulose acylate solution.

Composition of Cellulose Acylate Solution

| | |
|---|---|
| Methylene chloride | 288 parts by mass |
| Methanol | 58 parts by mass |
| Triphenyl phosphate | 3.4 parts by mass |
| Biphenyldiphenyl phosphate | 1.7 parts by mass |
| Cellulose acylate (ratio between substituents: acetyl group/phenylacyl group/hydroxyl group = 0.4/1.1/1.5) | 43.4 parts by mass |
| Retardation agent A | 2.4 parts by mass |
| Silicon dioxide fine particles | 0.12 parts by mass |

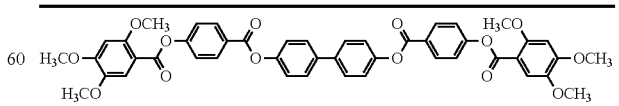

Retardation agent A

The cellulose acylate solution obtained as above was filtered through filter paper having a pore size of 2.5 µm, thereby obtaining a cellulose acylate dope. The obtained dope was heated to 30° C. and cast by using a band casting machine. After the film surface temperature on the band reached 40° C., the film was dried with hot air at a temperature of 60° C. for 1 minute and peeled off from the band.

The end portions of the peeled off film were held by clips of a tenter, and the film was stretched in the width direction. The temperature of air supplied to the tenter zone was set to be 140° C., and the stretching processing was performed at a stretch ratio of 1.20-fold.

The film having undergone the stretching processing was separated from the tenter, and the end portions of the film were cut off. Thereafter, the film was subjected to drying processing at a temperature of 140° C. such that a predetermined optical performance was realized, thereby preparing a support 1. The thickness of the film was 80 μm.

(Preparation of Support 2)

The following composition was put into a mixing tank and stirred while being heated so as to dissolve the respective components, thereby preparing a cellulose acylate solution.

Composition of Cellulose Acylate Solution

| Methylene chloride | 319 parts by mass |
| Methanol | 89 parts by mass |
| Triphenyl phosphate | 3.4 parts by mass |
| Biphenyldiphenyl phosphate | 1.7 parts by mass |
| Cellulose acylate (ratio between substituents: acetyl group/phenylacyl group/hydroxyl group = 0.4/1.1/1.5) | 43.4 parts by mass |
| Retardation agent A | 7.8 parts by mass |
| Silicon dioxide fine particles | 0.12 parts by mass |

A support 2 was prepared by the same method as the method for preparing the support 1, except that the stretch ratio at the time of the stretching processing was changed to 1.16-fold from 1.20-fold, and the drying processing was performed at 135° C. The thickness of the film was 60 μm.

(Preparation of Support 3)

The following composition was put into a mixing tank and stirred while being heated so as to dissolve the respective components, thereby preparing a cellulose acylate solution.

Composition of Cellulose Acylate Solution

| Methylene chloride | 324 parts by mass |
| Methanol | 94 parts by mass |
| Triphenyl phosphate | 3.4 parts by mass |
| Biphenyldiphenyl phosphate | 1.7 parts by mass |
| Cellulose acylate (ratio between substituents: acetyl group/phenylacyl group/hydroxyl group = 2.5/0.3/0.2) | 43.4 parts by mass |
| Retardation agent A | 8.7 parts by mass |
| Silicon dioxide fine particles | 0.12 parts by mass |

A support 3 was prepared by the same method as the method for preparing the support 1, except that the stretch ratio at the time of the stretching processing was changed to 1.23-fold from 1.20-fold, and the drying processing was performed at 135° C. The thickness of the film was 50 μm.

(Preparation of Support 4)

Polycarbonate pellets were dissolved in methylene chloride, cast onto a band made of a metal, and then dried, thereby obtaining a polycarbonate film having a thickness of 80 μm. Under a temperature condition of 170° C., the polycarbonate film was biaxially stretched such that the film was stretched 4.0% in the longitudinal direction and stretched 1.0% in the width direction by using a tenter stretching machine, thereby obtaining a support 4 having a thickness of 75 μm.

The optical characteristics of the supports 1 to 4 are shown in Table 1.

In each of the supports 1 to 4, the in-plane slow axis of the support is parallel to the longitudinal direction thereof.

TABLE 1

| Support name | Rth(550) | Re(550) |
|---|---|---|
| Support 1 | −100 nm | 97.5 nm |
| Support 2 | −40 nm | 99.5 nm |
| Support 3 | 40 nm | 97.5 nm |
| Support 4 | 80 nm | 99.5 nm |

Example 1

Alkaline Saponification Processing

The support 3 was passed through a dielectric heating roll at 60° C. to increase the film surface temperature to 40° C., and then the band surface of the film was coated with an alkaline solution that had the following composition by using a bar coater at a coating amount of 14 ml/m$^2$. The resultant was transported for 10 seconds under a steam-type far infrared heater manufactured by Noritake, Co, Limited, heated at 110° C., and then coated with pure water at 3 ml/m$^2$ by using the same bar coater. Thereafter, the resultant was washed three times with water by using a fountain coater, drained three times by using an air knife, and dried by being transported for 10 seconds in a drying zone at 70° C., whereby a cellulose acylate film having undergone alkaline saponification processing was prepared.

(Composition of Alkaline Solution)

Composition of Alkaline Solution (Part(s) by Mass)

| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 parts by mass |
| Propylene glycol | 14.8 parts by mass |

(Formation of Alignment Film)

The long cellulose acylate film having undergone alkaline saponification processing as described above was continuously coated with a coating liquid for alignment film having the following composition by using a 48 wire bar. The film was then dried with hot air at 100° C. for 2 minutes to obtain an alignment film having a thickness of 0.6 μm.

Modified polyvinyl alcohol was added to the coating liquid for alignment film in such an amount that yielded a solid content concentration of 4 wt %.

Composition of Coating Liquid for Alignment Film

Modified polyvinyl alcohol described below

| Water | 70 parts by mass |
| Methanol | 30 parts by mass |

$$-(CH_2-CH)_{96.8}(CH_2-CH)_{1.5}(CH_2-CH)_{1.7}- \quad CH_3$$
$$\phantom{-(CH_2-}|\phantom{CH)_{96.8}(CH_2-}|\phantom{CH)_{1.5}(CH_2-}|\phantom{CH)_{1.7}-\quad}|$$
$$\phantom{-(CH_2-}OH\phantom{)_{96.8}(CH_2-}OCOCH_3\phantom{(CH_2-}OCONHCH_2CH_2OCOC=CH_2$$

(Formation of First Optically Anisotropic Layer)

Rubbing processing was continuously performed on the alignment film prepared as above. At this time, the rubbing condition was regulated such that the longitudinal direction of the long film was in parallel with the transport direction thereof, and the rubbing direction relative to the longitudinal direction of the film became −36.6°.

Regarding the angle of the rubbing direction, when the support is observed from the surface on which the optically anisotropic layer, which will be described later, is to be laminated, the longitudinal direction of the support is regarded as being 0° as a standard. Under this condition, the angular value is expressed with a positive value in the counter clockwise direction and expressed with a negative value in the clockwise direction.

Thereafter, the alignment film prepared as above was coated with the discotic liquid crystal compound-containing coating liquid (DLC (1)) described in Table 2 by using a #4 wire bar. The transport velocity (V) of the film was set to 5 m/min. In order to dry the solvent in the coating liquid and to cause the alignment of the discotic liquid crystal compound to be matured, the film was heated with hot air at 110° C. for 2 minutes. Subsequently, the film was subjected to UV irradiation (50 mJ/cm$^2$) at 80° C. in a nitrogen atmosphere to fix the alignment of the liquid crystal compound. The thickness of the first optically anisotropic layer was 1.25 μm. Δnd at 550 nm was 286 nm.

The helix angle of the discotic liquid crystal compound in the first optically anisotropic layer was 28.6°, and the discotic liquid crystal compound formed a right-handed helix structure.

Herein, for checking the helix structure of the discotic liquid crystal compound, the second optically anisotropic layer was observed from the side of the first optically anisotropic layer, and based on the in-plane slow axis of a surface, which is on the side opposite to the second optically anisotropic layer, of the first optically anisotropic layer, whether the in-plane slow axis was right-handed or left-handed was determined.

(Preparation of Polarizing Film)

A polyvinyl alcohol (PVA) film having a thickness of 80 μm was stained by being dipped into an aqueous iodine solution with an iodine concentration of 0.05% by mass for 60 seconds at 30° C. Thereafter, while being dipped into an aqueous boric acid solution with a boric acid concentration of 4% by mass for 60 seconds, the film was stretched lengthwise to obtain a length five times longer than the original length, and then dried at 50° C. for 4 minutes, thereby obtaining a polarizing film having a thickness of 20 μm.

(Preparation of Polarizing Film-Protecting Film)

"TD80UL" (manufactured by Fujifilm Corporation) which is a commercially available cellulose acylate-based film was prepared and dipped into an aqueous sodium hydroxide solution of 1.5 mol/L and 55° C. Thereafter, the sodium hydroxide was sufficiently washed off by water. Subsequently, the film was dipped into an aqueous dilute sulfuric solution of 0.005 mol/L and 35° C. for 1 minute and then dipped into water to sufficiently wash off the aqueous dilute sulfuric acid solution. Finally, the sample was sufficiently dried at 120° C.

(Preparation of Circularly Polarizing Plate)

The aforementioned polarizing film and the polarizing film-protecting film were continuously stuck to the exposed surface of the first optically anisotropic layer of the retardation plate, which had the second optically anisotropic layer and the first optically anisotropic layer prepared as above, by using a polyvinyl alcohol-based adhesive, thereby preparing a long circularly polarizing plate (P-1). That is, the circularly polarizing plate (P-1) has the polarizing film-protecting film, the polarizing film, the first optically anisotropic layer, and the second optically anisotropic layer in this order.

The absorption axis of the polarizing film was parallel to the in-plane slow axis of the second optically anisotropic layer. Furthermore, based on the in-plane slow axis (0°) of the second optically anisotropic layer, the in-plane slow axis in a surface, which was on the side of the polarizing film, of the first optically anisotropic layer was in a position of −8.0°, and the in-plane slow axis in a surface, which was on the side of the second optically anisotropic layer, of the first optically anisotropic layer was in a position of −33.6°. In addition, the liquid crystal compound in the first optically anisotropic layer formed a clockwise helix.

In order to determine the rotation angle of the in-plane slow axis, the retardation plate was observed from the side of the polarizing film, and based on the in-plane slow axis (0°) of the second optically anisotropic layer, the counter-clockwise rotation angle was indicated by a positive angular value, and the clockwise rotation angle was indicated by a negative angular value.

Example 2

A circularly polarizing plate (P-2) was manufactured according to the same procedure as in Example 1, except that the support 1 was used instead of the support 3, and RLC (1) was used instead of DLC (1).

The angular relationship between the absorption axis of the polarizing film and the in-plane slow axis of each of the first optically anisotropic layer and the second optically anisotropic layer that is established in the circularly polarizing plate (P-2) was the same as the angular relationship in the circularly polarizing plate (P-1).

Example 3

A circularly polarizing plate (P-3) was manufactured according to the same procedure as in Example 1, except that the support 4 was used instead of the support 3; plasma surface processing was performed instead of alkali saponification processing; the rubbing direction of the alignment film was regulated such that the rubbing angle became −36.6° to −13.6°; DLC (2) was used instead of DLC (1); w and the absorption axis of the polarizing film and the in-plane slow axis of the second optically anisotropic layer were made orthogonal to each other.

The absorption axis of the polarizing film was orthogonal to the in-plane slow axis of the second optically anisotropic layer. Furthermore, based on the in-plane slow axis (0°) of the second optically anisotropic layer, the in-plane slow axis in a surface, which was on the side of the polarizing film, of the first optically anisotropic layer, was in a position of 10.3°, and the in-plane slow axis in a surface, which was on the side of the second optically anisotropic layer, of the first optically anisotropic layer was in a position of −13.6°. The liquid crystal compound in the first optically anisotropic layer formed a clockwise helix.

Example 4

A circularly polarizing plate (P-4) was manufactured according to the same procedure as in Example 3, except that the support 2 was used instead of the support 4, and RLC (2) was used instead of DLC (2).

The angular relationship between the absorption axis of the polarizing film and the in-plane slow axis of each of the first optically anisotropic layer and the second optically anisotropic layer that was established in the circularly polarizing plate (P-4) was the same as the angular relationship in the circularly polarizing plate (P-3).

The following Table 2 shows the composition of DLC (1) and (2) and the composition of RLC (1) and (2) used in Examples 1 to 4.

Herein, at the time of preparing the optically anisotropic layer by using any of DLC (1) and (2) or RLC (1) and (2), the alignment temperature, the alignment time, the polymerization temperature, and the like were set according to the conditions described in Table 2.

The relationship between the absorption axis of the polarizing film and the in-plane slow axis of each of the first optically anisotropic layer and the second optically anisotropic layer that was established in Examples 1 and 2 corresponds to the embodiment shown in FIG. 4 described above.

Furthermore, the relationship between the absorption axis of the polarizing film and the in-plane slow axis of each of the first optically anisotropic layer and the second optically anisotropic layer that was established in Examples 3 and 4 corresponds to the embodiment shown in FIG. 8 described above.

The results obtained from the aforementioned examples are summarized below.

In Examples 1 to 4, Δnd and the retardation (Re(550)) of the first optically anisotropic layer and the second optically anisotropic layer, and the angle formed between the absorption axis of the polarizing film and the in-plane slow axis of the first and second optically anisotropic layers were measured using an Axoscan manufactured by Axometrics, Inc.

In order to determine the angle of the rubbing direction shown in Table 3, the second optically anisotropic layer is observed from the side of the surface (side of the polarizing film) on which the first optically anisotropic layer is laminated, and based on the in-plane slow axis (0°) of the second optically anisotropic layer, the counter-clockwise direction is indicated by a positive angular value, and the clockwise direction is indicated by a negative angular value.

In Examples 1 and 2, based on the in-plane slow axis (0°) of the second optically anisotropic layer, the in-plane slow axis in a surface, which is on the side of the second optically anisotropic layer, of the first optically anisotropic layer is in a position of −33.6°, and the first optically anisotropic layer forms a clockwise helix. Therefore, Examples 1 and 2 meet the requirements (B) and (F).

TABLE 2

| | DLC(1) | DLC(2) | RLC(1) | RLC(2) |
|---|---|---|---|---|
| Liquid crystal compound | Compound 1 (100 parts by mass) | | Compound 2 (100 parts by mass) | |
| Initiator | Irgacure 907, manufactured by Ciba-Geigy Corporation (3 parts by mass) | | | |
| Sensitizer | Kayacure DETX, manufactured by Nippon Kayaku Co., Ltd. (1 part by mass) | | | |
| Alignment assistant agent | Compound 3 (0.2 parts by mass) | | None | |
| Air interface alignment agent | None | | Compound 4 (0.2 parts by mass) | |
| Chiral agent (Paliocolor LC-756, manufactured by BASF Corporation) | 0.86 parts by mass | 0.76 parts by mass | 0.08 parts by mass | 0.07 parts by mass |
| Solvent | Methyl ethyl ketone | | | |
| Solid content concentration | 25.4 wt % | 24.1 wt % | 23.6 wt % | 22.4 wt % |
| Wire bar | #4 | | | |
| Alignment temperature | 110° C. | | 95° C. | |
| Polymerization time | 2 minutes | | 1.5 minutes | |
| Polymerization temperature | 80° C. | | 60° C. | |
| UV irradiation amount | 500 mJ/cm² | | | |
| N₂ purging | Performed | | | |

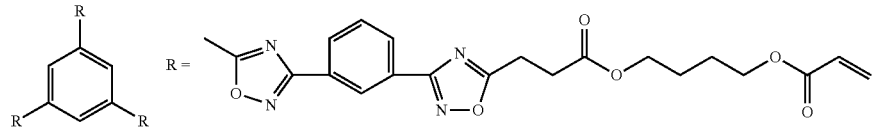

Compound 1

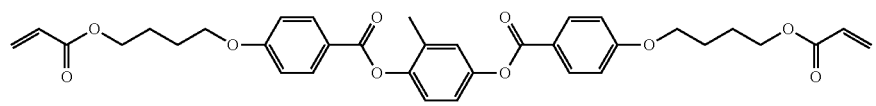

Compound 2

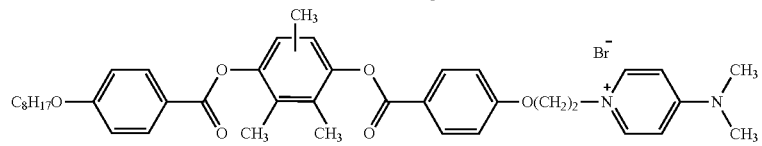

Compound 3

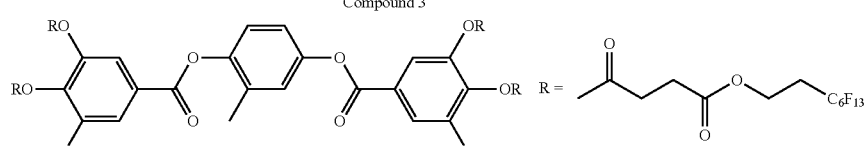

Compound 4

Furthermore, in Examples 3 and 4, based on the in-plane slow axis (0°) of the second optically anisotropic layer, the in-plane slow axis in a surface, which is on the side of the second optically anisotropic layer, of the first optically anisotropic layer is in a position of −13.6°, and the first optically anisotropic layer forms a clockwise helix. Therefore, Examples 3 and 4 meet the requirements (D) and (H).

TABLE 3

|  |  | Example 1 | Example 2 | Example 3 | Example 4 |
|---|---|---|---|---|---|
| First optically anisotropic layer | Coating liquid | DLC(1) | RLC(1) | DLC(2) | RLC(2) |
|  | Helix angle (°) | 28.6 | 28.6 | 23.9 | 23.9 |
|  | Δnd(550 nm) (nm) | 286 | 286 | 271 | 271 |
|  | Alignment film | Alignment film 1 | | | |
|  | Rubbing direction(°) | −36.6 | −36.6 | −13.6 | −13.6 |
| Second optically anisotropic layer (=support) | Type | Support 3 | Support 1 | Support 4 | Support 2 |
|  | Re(550) (nm) | 97.5 | 97.5 | 99.5 | 99.5 |
| Constitution of circularly polarizing plate | | Constituted with polarizing film, first optically anisotropic layer, and second optically anisotropic layer laminated on each other in this order | | | |
| Relationship between second optically anisotropic layer and absorption axis of polarizing film | | Parallel | Parallel | Orthogonal | Orthogonal |
| Rotation angle (°) of slow axis in surface, which is on the side of polarizing film, of first optically anisotropic layer with respect to in-plane slow axis of second optically anisotropic layer | | −8.0 | −8.0 | 10.6 | 10.6 |
| Rotation angle (°) of slow axis in surface, which is on the side of second optically anisotropic layer, of first optically anisotropic layer with respect to in-plane slow axis of second optically anisotropic layer | | −36.6 | −36.6 | −13.6 | −13.6 |

Comparative Examples 1 and 2

Polycarbonate having a weight average molecular weight of 100,000 was dissolved in methylene chloride to obtain a solution of 18% by mass. The solution was casted on a glass plate such that the thickness of the dry film became 80 μm. The film was dried for 30 minutes at room temperature and then dried for 1 hour at 70° C. The polycarbonate film was peeled from the glass plate, cut in a size of 10 cm×20 cm, and stretched by 4% in the longitudinal direction at 160° C., thereby obtaining a λ/4 plate as a retardation plate. Moreover, a λ/2 plate as a retardation plate was obtained according to the same procedure as described above, except that the polycarbonate film was stretched by 8% at 160° C. The in-plane slow axis of each of the retardation plates was in parallel with the longitudinal direction of the film. The value of retardation at a wavelength of 550 nm was 137.5 nm in the λ/4 plate, and was 275 nm in the λ/2 plate.

The aforementioned polarizing film and polarizing film-protecting film were stuck onto the λ/4 retardation plate prepared as above by using a polyvinyl alcohol-based adhesive, such that the in-plane slow axis of the retardation plate crossed the absorption axis of the polarizing film at 45°, thereby preparing a circularly polarizing plate (Comparative example 1). That is, the circularly polarizing plate has the polarizing film-protecting film, the polarizing film, and the λ/4 plate in this order.

Moreover, the λ/2 plate was stuck onto the λ/4 plate prepared as above by using an adhesive, such that the in-plane slow axes of each of the plates crossed each other at 60° C. Furthermore, the aforementioned polarizing film and the polarizing film-protecting film were stuck onto the λ/2 retardation plate by using a polyvinyl alcohol-based adhesive, such that the in-plane slow axis of the λ/2 retardation plate crossed the absorption axis of the polarizing film at 15°, thereby preparing a circularly polarizing plate (Comparative example 2). That is, the circularly polarizing plate (Comparative example 2) has the polarizing film-protecting film, the polarizing film, the λ/2 plate, and the λ/4 plate in this order.

The angle formed between the absorption axis of the polarizing film and the in-plane slow axis of the λ/2 plate was 15°, and the angle formed between the absorption axis of the polarizing film and the in-plane slow axis of the λ/4 plate was 75°.

<Mounting of Circularly Polarizing Plate on Organic EL Device and Evaluation of Display Performance>

(Mounting of Circularly Polarizing Plate on Display Apparatus)

An organic EL panel-mounted GALAXY SII manufactured by SAMSUNG was disassembled, and a circularly polarizing plate was peeled from the apparatus. Thereafter, the circularly polarizing plates prepared in Examples 1 to 4 and Comparative examples 1 and 2 were each stuck to the display apparatus such that the polarizing film-protecting film was disposed in the outside.

(Evaluation of Display Performance)

(Evaluation of Color Mixing)

The prepared organic EL display apparatus was evaluated in terms of the mixing of black with the other colors. The display apparatus was caused to display black, observed from the front, and evaluated based on the following criteria. The results are summarized in Table 4.

4: Color mixing is not observed at all. (Acceptable)

3: Color mixing is extremely slightly observed. (Acceptable)

2: Both the color mixing and reflected light are slightly observed, and this is unacceptable.

1: Color mixing is observed, and reflected light is observed to a large extent. This is unacceptable.

(Visibility)

The organic EL display apparatus prepared was evaluated in terms of the visibility and display quality under bright light. The display apparatus was caused to display white, black, and an image, and reflected light that was caused when fluorescent light is thrown to the apparatus from the front and at a polar angle of 45° was observed. The display quality obtained when light was thrown to the apparatus at a polar angle of 45° was compared to the display quality obtained when light was thrown thereto from the front, and evaluated based on the following criteria. The results are summarized in Table 4.

4: Color mixing is not observed at all. (Acceptable)

3: Color mixing is extremely slightly observed. (Acceptable)

2: Color mixing is observed, but reflected light is observed to a small extent. This is unproblematic for use. (Acceptable)

1: Color mixing is observed, and reflected light is observed to a large extent. This is unacceptable

TABLE 4

|  | Example 1 | Example 2 | Example 3 | Example 4 | Comparative example 1 | Comparative example 2 |
|---|---|---|---|---|---|---|
| Evaluation of color mixing | 4 | 4 | 4 | 4 | 1 | 2 |
| Visibility under bright light | 4 | 4 | 4 | 4 | 1 | 2 |

As shown in Table 4, it was confirmed that the use of the retardation plate of the present invention inhibited color mixing.

In Comparative example 1 in which a λ/4 plate was used, and in Comparative example 2 in which a λ/4 plate and a λ/2 plate were used, the evaluation result of the color mixing was poor.

In Examples 1 and 2, the polarizing film was stuck to the retardation plate such that the absorption axis of the polarizing film and the in-plane slow axis of the second optically anisotropic layer became parallel to each other. However, when the polarizing film was stuck to the retardation plate such that an angle of 90° was formed between the absorption axis of the polarizing film and the in-plane slow axis of the second optically anisotropic layer, the evaluation result of the color mixing and visibility was also "4" as in Examples 1 and 2.

When an angle of 90° C. is formed between the absorption axis of the polarizing film and the in-plane slow axis of the second optically anisotropic layer as described above, the angular relationship between the absorption axis of the polarizing film and the in-plane slow axis of the second optically anisotropic layer satisfies the relationship described in the requirement (Y). That is, the embodiment, in which the polarizing film is stuck to the retardation plate such that an angle of 90° C. is formed between the absorption axis of the polarizing film and the in-plane slow axis of the second optically anisotropic layer, corresponds to the embodiment shown in FIGS. 5A and 5B described above.

Moreover, in Examples 3 and 4, the polarizing film was stuck to the retardation plate such that the absorption axis of the polarizing film and the in-plane slow axis of the second optically anisotropic layer became orthogonal to each other. However, when the polarizing film was stuck to the retardation plate such that an angle of 0° formed between the absorption axis of the polarizing film and the in-plane slow axis of the second optically anisotropic layer (the absorption axis of the polarizing film and the in-plane slow axis of the second optically anisotropic layer were parallel to each other), the evaluation result of the color mixing and visibility was also "4" as in Examples 3 and 4.

When an angle of 0° is formed between the absorption axis of the polarizing film and the in-plane slow axis of the second optically anisotropic layer as described above, the angular relationship between the absorption axis of the polarizing film and the in-plane slow axis of the second optically anisotropic layer satisfies the relationship described in the requirement (Z). That is, the embodiment, in which the polarizing film is stuck to the retardation plate such that an angle of 0° is formed between the absorption axis of the polarizing film and the in-plane slow axis of the second optically anisotropic layer, corresponds to the embodiment shown in FIGS. 7A and 7B described above.

In the aforementioned examples, the first optically anisotropic layer was manufactured by using a liquid crystal compound forming a right-handed helix structure. However, in cases in which a liquid crystal compound forming a left-handed helix structure was used (cases of the requirements (A), (C), (E), and (G)), by adjusting the relationship between the absorption axis of the polarizing film, the in-plane slow axis of the first optically anisotropic layer, and the in-plane slow axis of the second optically anisotropic layer as described above, a circularly polarizing plate exhibiting intended characteristics could also be formed.

What is claimed is:

1. A circularly polarizing plate comprising a polarizing film, a first optically anisotropic layer, and a second optically anisotropic layer in this order, and satisfying a following requirement (A) or (B), wherein the first optically anisotropic layer contains a twisted aligned liquid crystal compound of which a helical axis is a thickness direction of the first optically anisotropic layer, a helix angle of the liquid crystal compound in the first optically anisotropic layer is 28.6±10°, an absorption axis of the polarizing film and an in-plane slow axis of the second optically anisotropic layer are parallel or orthogonal to each other, a value of $\Delta n d$, which is a product of a refractive index anisotropy $\Delta n$ of the first optically anisotropic layer measured at a wavelength of 550 nm and a thickness d of the first optically anisotropic layer, satisfies a following expression (1), and ReB(550), which is a value of retardation of the second optically anisotropic layer measured at a wavelength of 550 nm, satisfies a following expression (2):

$$256 \text{ nm} \leq \Delta nd \leq 316 \text{ nm}; \quad \text{expression (1)}$$

$$67.5 \text{ nm} \leq ReB(550) \leq 127.5 \text{ nm}; \quad \text{expression (2)}$$

requirement (A): on condition that the circularly polarizing plate is observed from a side of the polarizing film, counter-clockwise rotation is indicated by a positive angular value, based on an in-plane slow axis (0°) of the second optically anisotropic layer, the in-plane slow axis in a surface, which is on a side of the second optically anisotropic layer, of the first optically anisotropic layer is within a range of 33.6±10°, and the liquid crystal compound in the first optically anisotropic layer forms a counter-clockwise helix; or requirement (B): on condition that the circularly polarizing plate is observed from the side of the polarizing film, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of −33.6±10°, and the liquid crystal compound in the first optically anisotropic layer forms a clockwise helix.

2. The circularly polarizing plate according to claim 1, wherein the liquid crystal compound is a discotic liquid crystal compound or a rod-like liquid crystal compound.

3. An organic electroluminescence display apparatus comprising:
the circularly polarizing plate according to claim 1.

4. An organic electroluminescence display apparatus comprising:
the circularly polarizing plate according to claim 2.

5. A circularly polarizing plate comprising a polarizing film, a first optically anisotropic layer, and a second optically anisotropic layer in this order, and satisfying a following requirement (C) or (D),
wherein the first optically anisotropic layer contains a twisted aligned liquid crystal compound of which a helical axis is a thickness direction of the first optically anisotropic layer,
a helix angle of the liquid crystal compound in the first optically anisotropic layer is 23.9±10°,
an absorption axis of the polarizing film and an in-plane slow axis of the second optically anisotropic layer are parallel or orthogonal to each other,
a value of $\Delta nd$, which is a product of a refractive index anisotropy $\Delta n$ of the first optically anisotropic layer measured at a wavelength of 550 nm and a thickness d of the first optically anisotropic layer, satisfies a following expression (3), and
ReB(550), which is a value of retardation of the second optically anisotropic layer measured at a wavelength of 550 nm, satisfies a following expression (4):

$$241 \text{ nm} \leq \Delta nd \leq 301 \text{ nm};\quad\quad\quad \text{expression (3)}$$

$$69.5 \text{ nm} \leq ReB(550) \leq 129.5 \text{ nm};\quad\quad\quad \text{expression (4)}$$

requirement (C): on condition that the circularly polarizing plate is observed from a side of the polarizing film, counter-clockwise rotation is indicated by a positive angular value, based on an in-plane slow axis (0°) of the second optically anisotropic layer, the in-plane slow axis in a surface, which is on a side of the second optically anisotropic layer, of the first optically anisotropic layer is within a range of 13.6±10°, and the liquid crystal compound in the first optically anisotropic layer forms a counter-clockwise helix; or
requirement (D): on condition that the circularly polarizing plate is observed from the side of the polarizing film, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of −13.6±10°, and the liquid crystal compound in the first optically anisotropic layer forms a clockwise helix.

6. The circularly polarizing plate according to claim 5, wherein the liquid crystal compound is a discotic liquid crystal compound or a rod-like liquid crystal compound.

7. An organic electroluminescence display apparatus comprising:
the circularly polarizing plate according to claim 5.

8. An organic electroluminescence display apparatus comprising:
the circularly polarizing plate according to claim 6.

9. A retardation plate for a circularly polarizing plate comprising a first optically anisotropic layer and a second optically anisotropic layer, and satisfying a following requirement (E) or (F),
wherein the first optically anisotropic layer contains a twisted aligned liquid crystal compound of which a helical axis is a thickness direction of the first optically anisotropic layer,
a helix angle of the liquid crystal compound in the first optically anisotropic layer is 28.6±10°,
a value of $\Delta nd$, which is a product of a refractive index anisotropy $\Delta n$ of the first optically anisotropic layer measured at a wavelength of 550 nm and a thickness d of the first optically anisotropic layer, satisfies a following expression (1), and
ReB(550), which is a value of retardation of the second optically anisotropic layer measured at a wavelength of 550 nm, satisfies a following expression (2):

$$256 \text{ nm} \leq \Delta nd \leq 316 \text{ nm};\quad\quad\quad \text{expression (1)}$$

$$67.5 \text{ nm} \leq ReB(550) \leq 127.5 \text{ nm};\quad\quad\quad \text{expression (2)}$$

requirement (E): on condition that the retardation plate for a circularly polarizing plate is observed from a side of the first optically anisotropic layer, counter-clockwise rotation is indicated by a positive angular value, based on an in-plane slow axis (0°) of the second optically anisotropic layer, the in-plane slow axis in a surface, which is on a side of the second optically anisotropic layer, of the first optically anisotropic layer is within a range of 33.6±10°, and the liquid crystal compound in the first optically anisotropic layer forms a counter-clockwise helix; or
requirement (F): on condition that the retardation plate for a circularly polarizing plate is observed from the side of the first optically anisotropic layer, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of −33.6±10°, and the liquid crystal compound in the first optically anisotropic layer forms a clockwise helix.

10. The retardation plate for a circularly polarizing plate according to claim 9,
wherein the liquid crystal compound is a discotic liquid crystal compound or a rod-like liquid crystal compound.

11. An organic electroluminescence display apparatus comprising:
the retardation plate for a circularly polarizing plate according to claim 9.

12. An organic electroluminescence display apparatus comprising:
the retardation plate for a circularly polarizing plate according to claim 10.

13. A retardation plate for a circularly polarizing plate comprising a first optically anisotropic layer and a second optically anisotropic layer, and satisfying a following requirement (G) or (H),
wherein the first optically anisotropic layer contains a twisted aligned liquid crystal compound of which a helical axis is a thickness direction of the first optically anisotropic layer,
a helix angle of the liquid crystal compound in the first optically anisotropic layer is 23.9±10°, a value of Δnd, which is a product of a refractive index anisotropy Δn of the first optically anisotropic layer measured at a wavelength of 550 nm and a thickness d of the first optically anisotropic layer, satisfies a following expression (3), and ReB(550), which is a value of retardation of the second optically anisotropic layer measured at a wavelength of 550 nm, satisfies a following expression (4):

$$241 \text{ nm} \leq \Delta nd \leq 301 \text{ nm}; \qquad \text{expression (3)}$$

$$69.5 \text{ nm} \leq ReB(550) \leq 129.5 \text{ nm};$$

requirement (G): on condition that the retardation plate for a circularly polarizing plate is observed from a side of the first optically anisotropic layer, counter-clockwise rotation is indicated by a positive angular value, based on an in-plane slow axis (0°) of the second optically anisotropic layer, the in-plane slow axis in a surface, which is on a side of the second optically anisotropic layer, of the first optically anisotropic layer is within a range of 13.6±10°, and the liquid crystal compound in the first optically anisotropic layer forms a counter-clockwise helix; or requirement (H): on condition that the retardation plate for a circularly polarizing plate is observed from the side of the first optically anisotropic layer, counter-clockwise rotation is indicated by a positive angular value, based on the in-plane slow axis (0°) of the second optically anisotropic layer, the in-plane slow axis in a surface, which is on the side of the second optically anisotropic layer, of the first optically anisotropic layer is within a range of −13.6±10°, and the liquid crystal compound in the first optically anisotropic layer forms a clockwise helix.

14. The retardation plate for a circularly polarizing plate according to claim 13,
wherein the liquid crystal compound is a discotic liquid crystal compound or a rod-like liquid crystal compound.

15. An organic electroluminescence display apparatus comprising:
the retardation plate for a circularly polarizing plate according to claim 13.

16. An organic electroluminescence display apparatus comprising:
the retardation plate for a circularly polarizing plate according to claim 14.

* * * * *